(12) United States Patent
Nemati et al.

(10) Patent No.: US 8,093,107 B1
(45) Date of Patent: Jan. 10, 2012

(54) THYRISTOR SEMICONDUCTOR MEMORY AND METHOD OF MANUFACTURE

(75) Inventors: Farid Nemati, Redwood City, CA (US); Scott Robins, San Jose, CA (US); Kevin J. Yang, Santa Clara, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 672 days.

(21) Appl. No.: 12/271,758

(22) Filed: Nov. 14, 2008

Related U.S. Application Data

(63) Continuation-in-part of application No. 11/881,159, filed on Jul. 25, 2007, now Pat. No. 7,894,256, which is a continuation-in-part of application No. 11/159,447, filed on Jun. 22, 2005, now Pat. No. 7,460,395.

(60) Provisional application No. 60/988,607, filed on Nov. 16, 2007.

(51) Int. Cl.
*H01L 21/332* (2006.01)
*H01L 21/337* (2006.01)
*H01L 21/8238* (2006.01)

(52) U.S. Cl. ........ 438/133; 438/134; 438/135; 438/137; 438/181; 438/231; 257/E21.388; 257/E21.389; 257/E21.548; 257/E21.646; 257/E21.661

(58) Field of Classification Search ........... 257/E21.388, 257/E21.389, E21.548, E21.572, E21.646, 257/E21.661
See application file for complete search history.

(56) References Cited

U.S. PATENT DOCUMENTS

| | | | |
|---|---|---|---|
| 4,604,728 A | 8/1986 | Okajima | |
| 5,285,083 A | 2/1994 | Pulfrey et al. | 257/52 |
| 5,346,849 A * | 9/1994 | Tokunoh | 438/421 |
| 5,412,598 A | 5/1995 | Shulman | 365/174 |
| 5,514,882 A | 5/1996 | Shulman | 257/105 |
| 5,612,242 A * | 3/1997 | Hsu | 438/223 |
| 6,046,475 A | 4/2000 | Chang et al. | |
| 6,104,045 A | 8/2000 | Forbes et al. | 257/141 |
| 6,128,216 A | 10/2000 | Noble, Jr. et al. | 365/154 |
| 6,225,165 B1 | 5/2001 | Noble, Jr. et al. | 438/268 |
| 6,229,161 B1 | 5/2001 | Nemati et al. | 257/133 |
| 6,462,359 B1 | 10/2002 | Nemati et al. | 257/107 |

(Continued)

OTHER PUBLICATIONS

Shulman, Dima D., "A Static Memory Cell Based on the Negative Resistance of the Gate Terminal of p-n-p-n Devices," IEEE Journal of Solid State Circuits. vol. 29, No. 6, 1994, pp. 733-736.

(Continued)

*Primary Examiner* — Mohsen Ahmadi
(74) *Attorney, Agent, or Firm* — The Webostad Firm

(57) ABSTRACT

A thyristor based semiconductor device includes a thyristor having cathode, P-base, N-base and anode regions disposed in electrical series relationship. The N-base region for the thyristor has a cross-section that defines an inverted "T" shape, wherein a buried well in semiconductor material forms is operable as a part of the N-base. The stem to the inverted "T" shape extends from the upper surface of the semiconductor material to the buried well. The P-base region for the thyristor extends laterally outward from a side of the stem that is opposite the anode region of the thyristor, and is further bounded between the buried well and a surface of the semiconductor material. A thinned portion for the N-base is defined between the cathode region of the thyristor and the buried well, and may include supplemental dopant of concentration greater than that for some other portion of the N-base.

22 Claims, 34 Drawing Sheets

U.S. PATENT DOCUMENTS

| | | | |
|---|---|---|---|
| 6,503,790 B2 | 1/2003 | Noble, Jr. et al. | 438/237 |
| 6,545,297 B1 | 4/2003 | Noble, Jr. et al. | 257/124 |
| 6,727,528 B1 | 4/2004 | Robins et al. | 257/133 |
| 6,767,770 B1 | 7/2004 | Horch et al. | 438/133 |
| 6,790,713 B1 | 9/2004 | Horch | 438/135 |
| 6,815,734 B1 | 11/2004 | Horch et al. | |
| 6,818,482 B1 | 11/2004 | Horch et al. | 438/138 |
| 6,885,581 B2 | 4/2005 | Nemati et al. | 365/159 |
| 6,888,176 B1 | 5/2005 | Horch et al. | |
| 6,944,051 B1 | 9/2005 | Lee et al. | |
| 7,015,077 B1 * | 3/2006 | Horch et al. | 438/135 |
| 7,042,759 B2 | 5/2006 | Nemati et al. | |
| 7,049,182 B1 * | 5/2006 | Horch et al. | 438/135 |
| 7,075,122 B1 | 7/2006 | Yang et al. | |
| 7,109,532 B1 * | 9/2006 | Lee et al. | 257/133 |
| 7,125,753 B1 * | 10/2006 | Horch et al. | 438/135 |
| 7,245,525 B1 | 7/2007 | Lee et al. | |
| 7,491,586 B2 * | 2/2009 | Horch et al. | 438/133 |
| 7,968,381 B1 * | 6/2011 | Horch et al. | 438/133 |
| 2005/0233506 A1 | 10/2005 | Horch et al. | |
| 2006/0139996 A1 | 6/2006 | Nemati et al. | |
| 2006/0227601 A1 | 10/2006 | Bhattacharyya | |

OTHER PUBLICATIONS

T. Park, et al., "Fabrication of Body-Tied Fin FETs (Omega MOSFETs) Using Bulk Si Wafers," 2003 Symp on VLSI Tech Dig of Tech Papers.

T. Sugizaki, et al., "Low Voltage/Sub-ns Operation Bulk Thyristor-SRAM (BT-RAM) cell with Double Selective Epitaxy Emitters (DEE)," 2007 Symposium on VLSI Tech Dig of Technology Digest of Technical Papers.

* cited by examiner

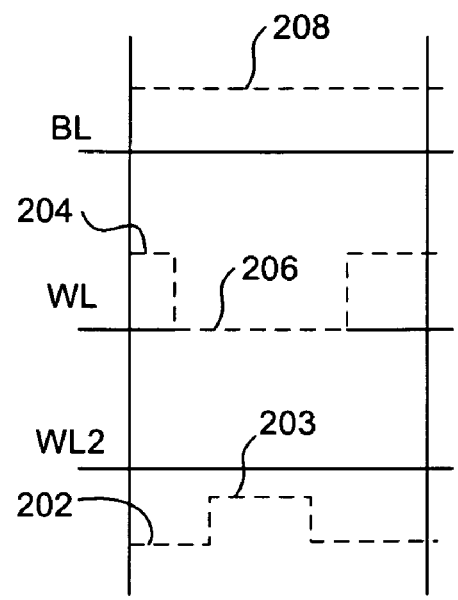
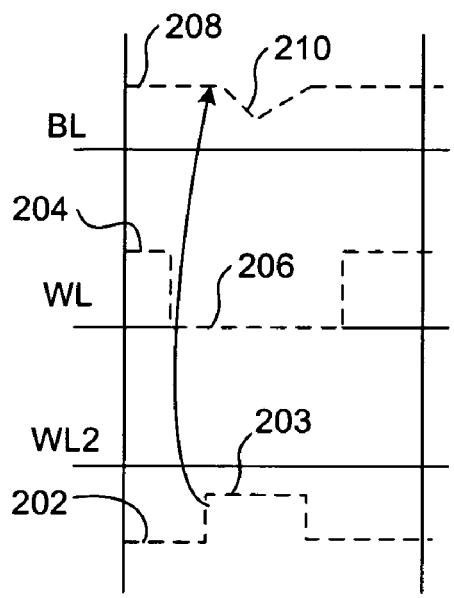
FIG. 3B  FIG. 3A
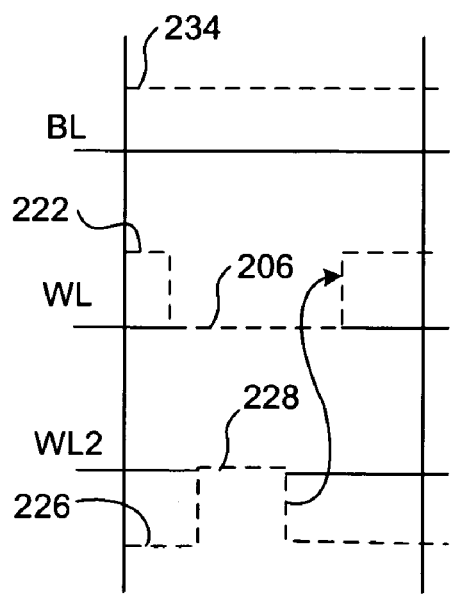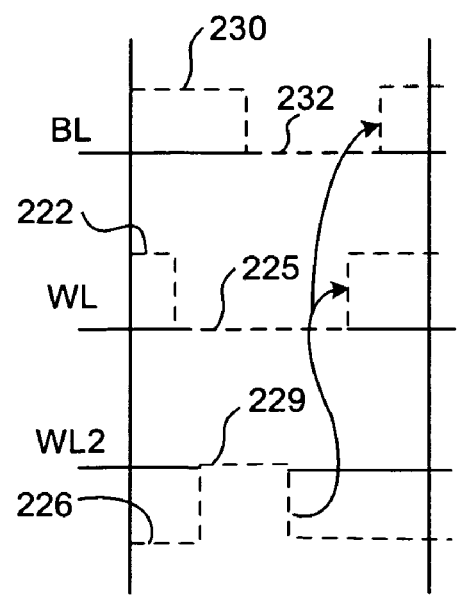
FIG. 4B  FIG. 4A

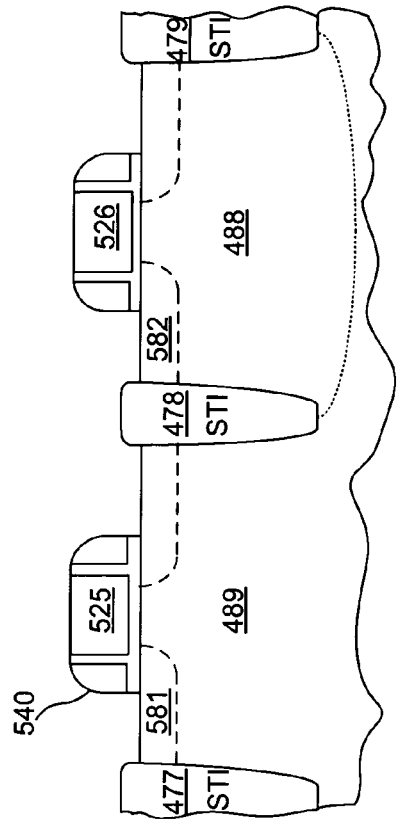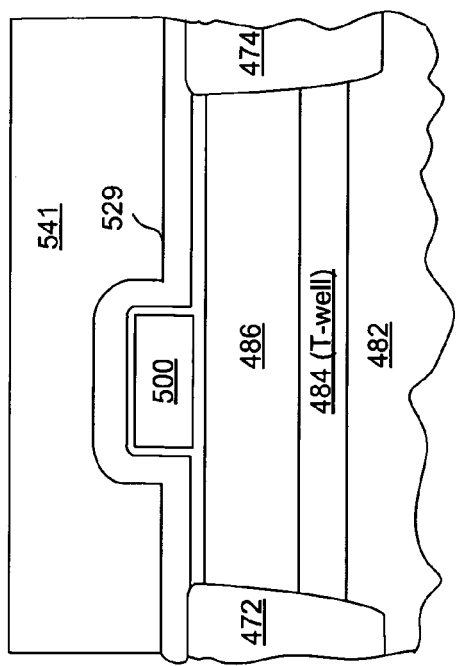
Fig. 12C
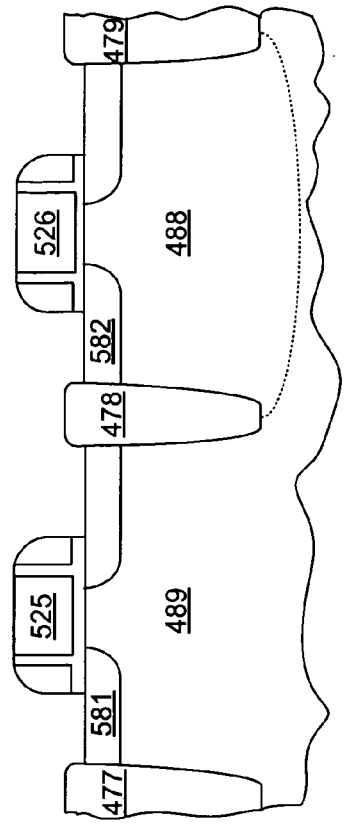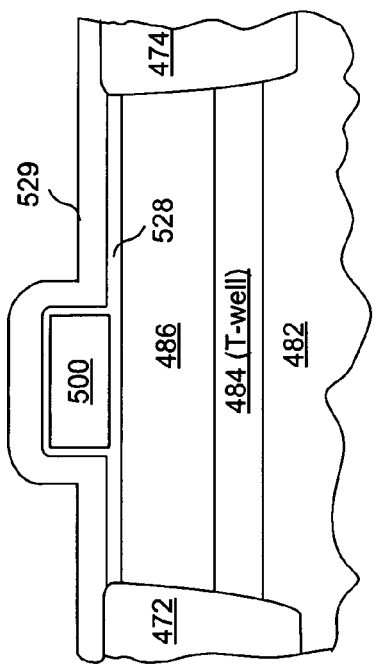
Fig. 12D

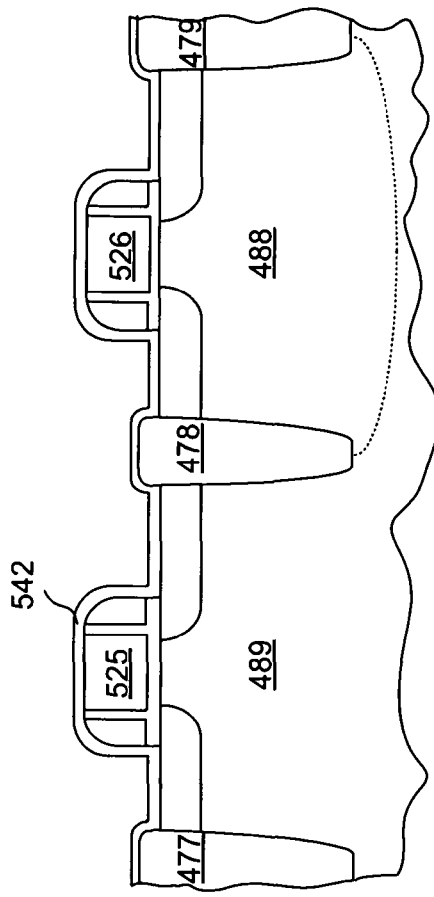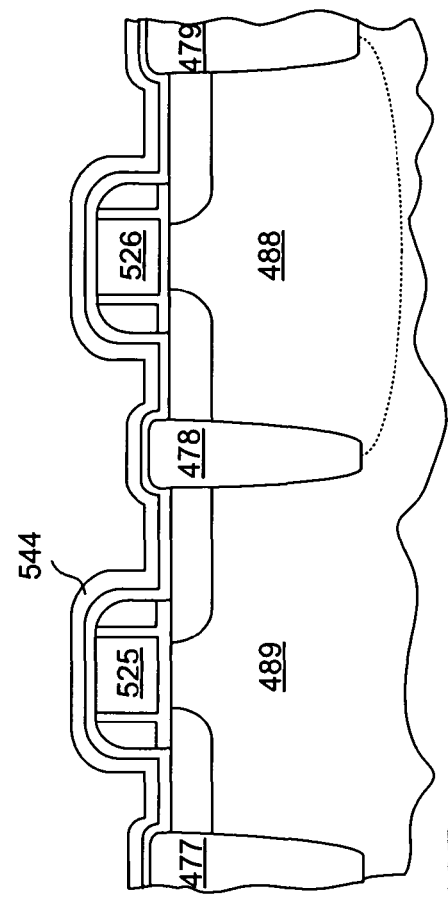
Fig. 12E
Fig. 12F

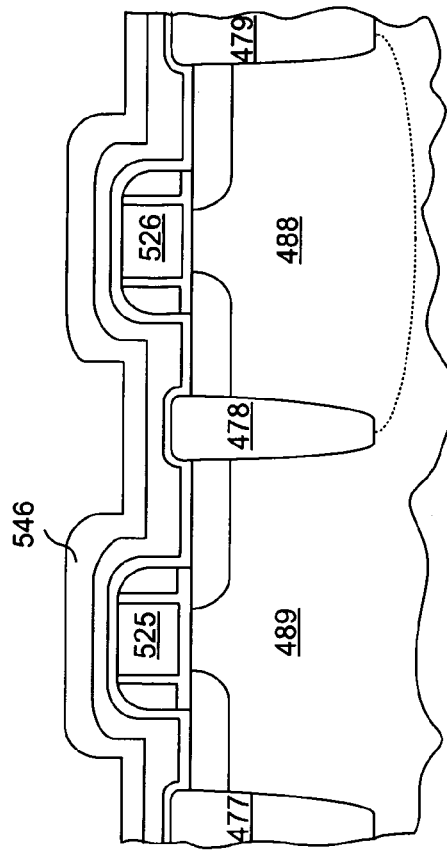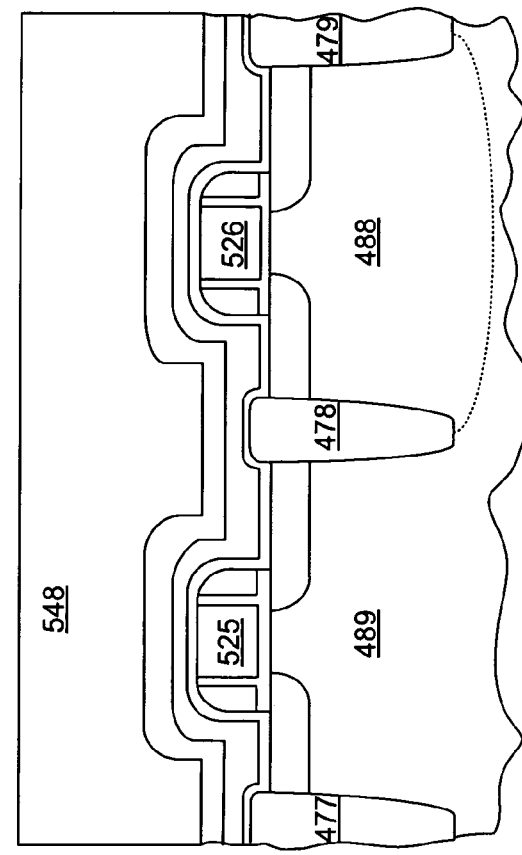
Fig. 12G
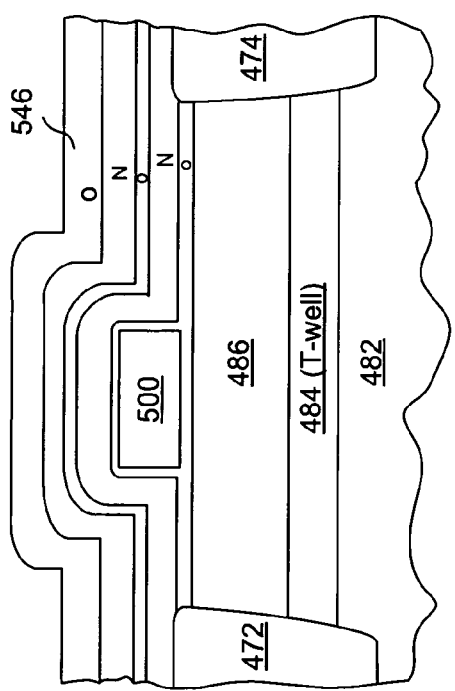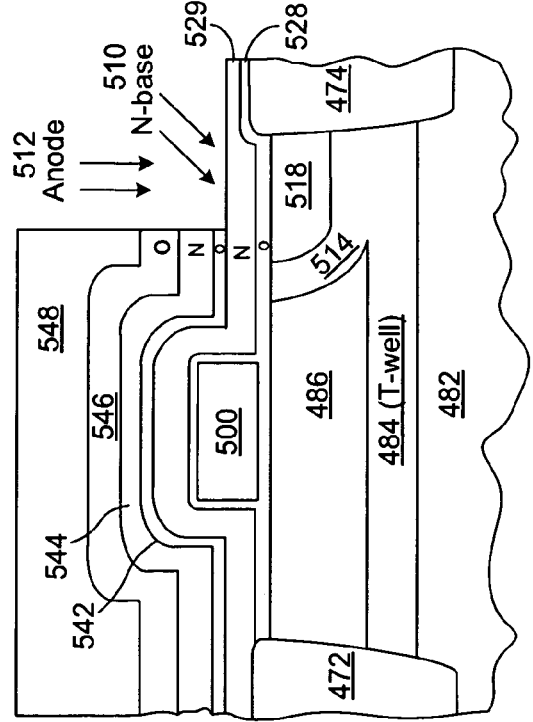
Fig. 12H

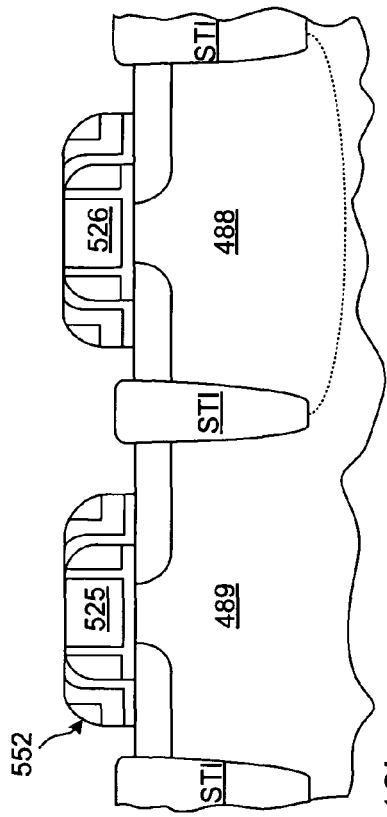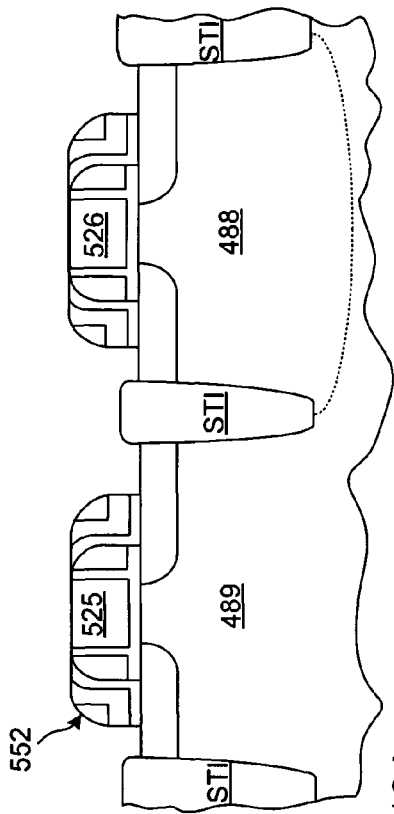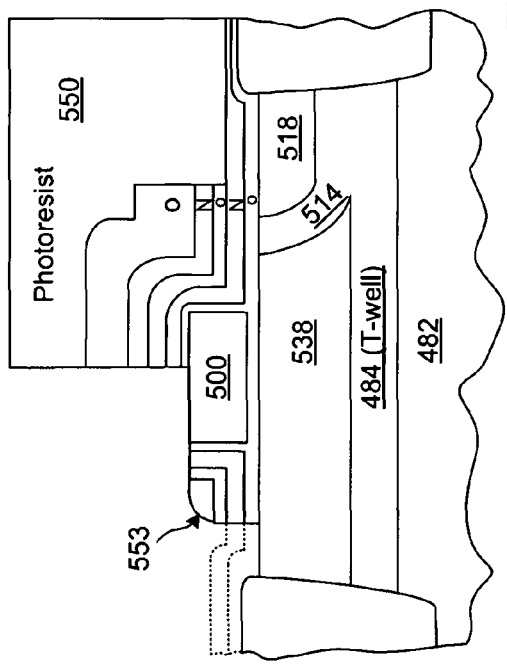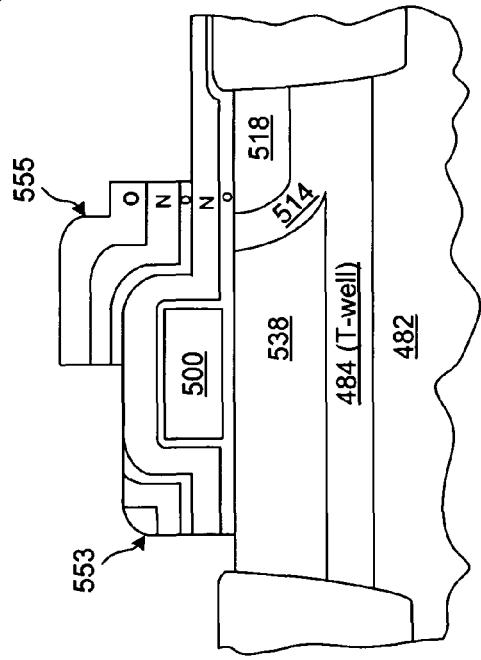
Fig. 12I
Fig. 12J

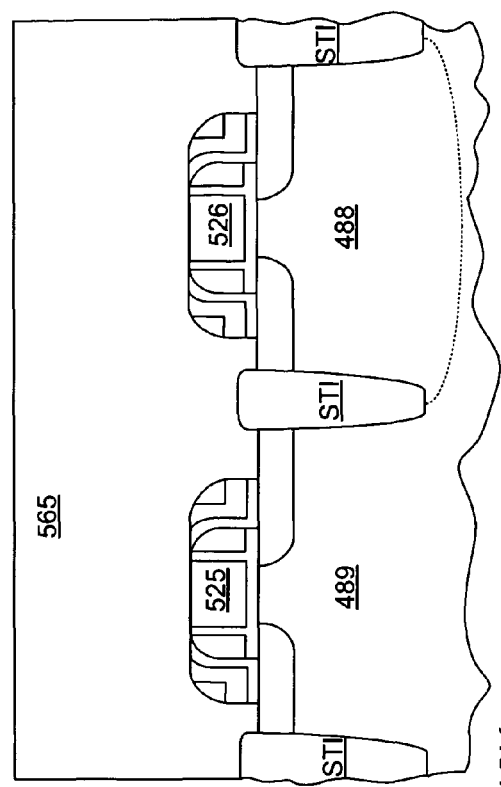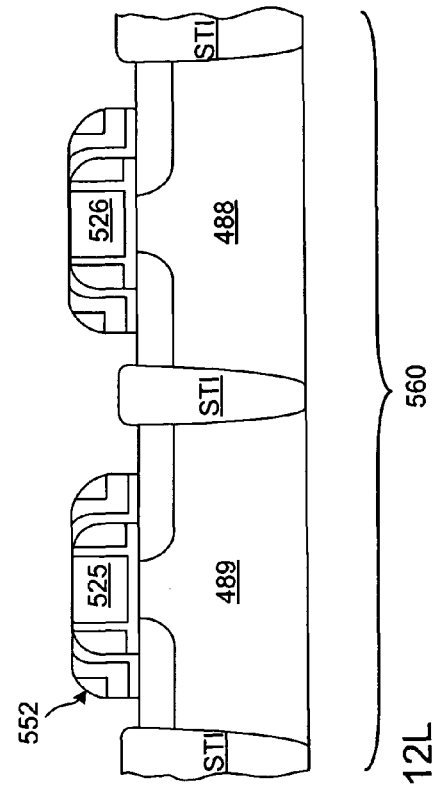
Fig. 12K
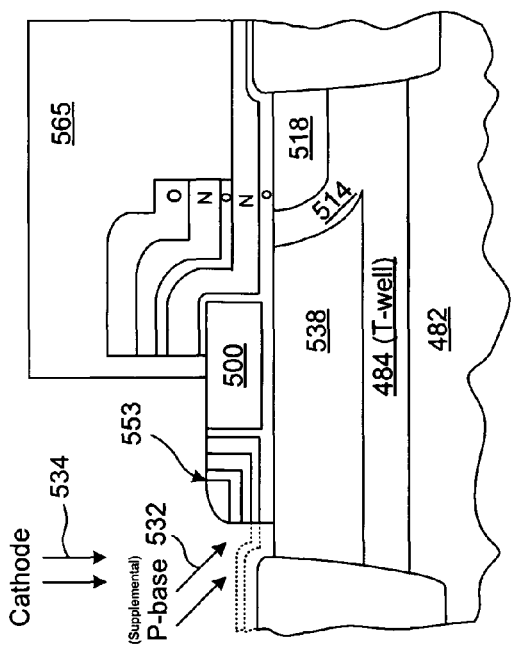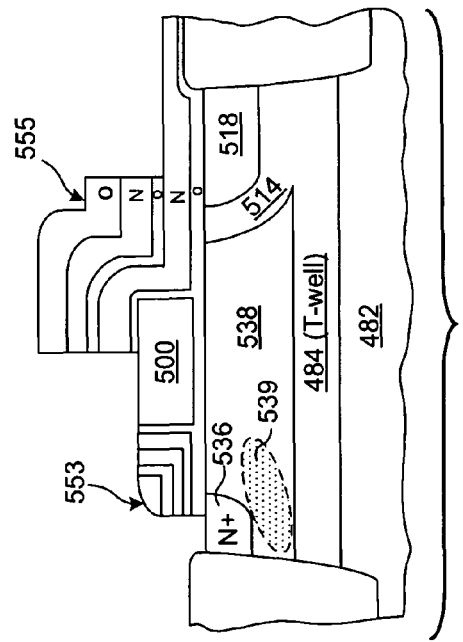
Fig. 12L

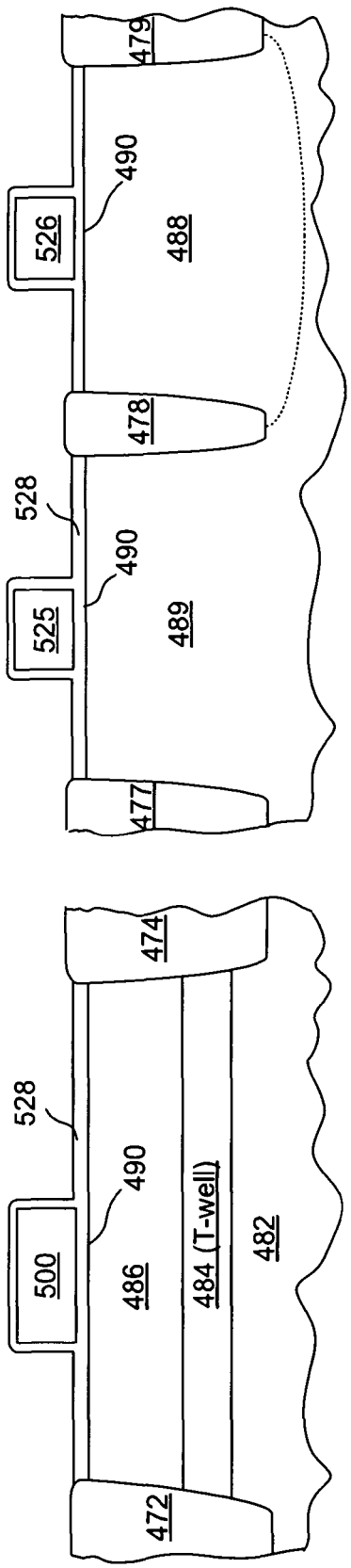
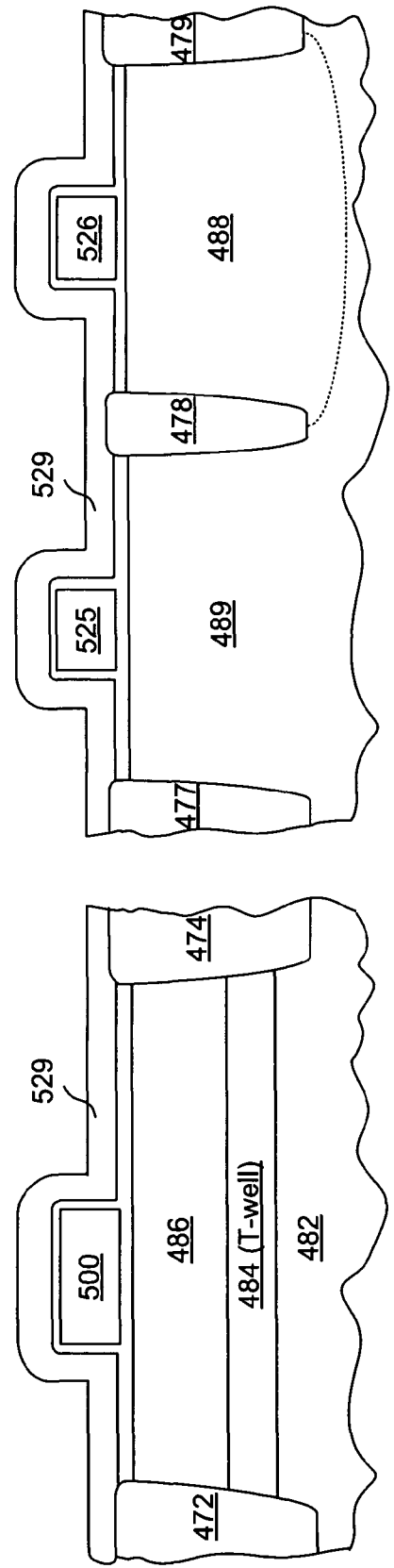
Fig. 13A
Fig. 13B

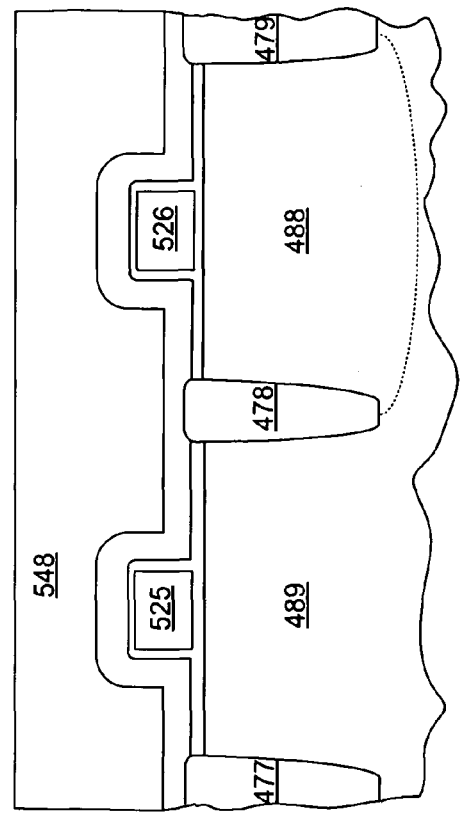
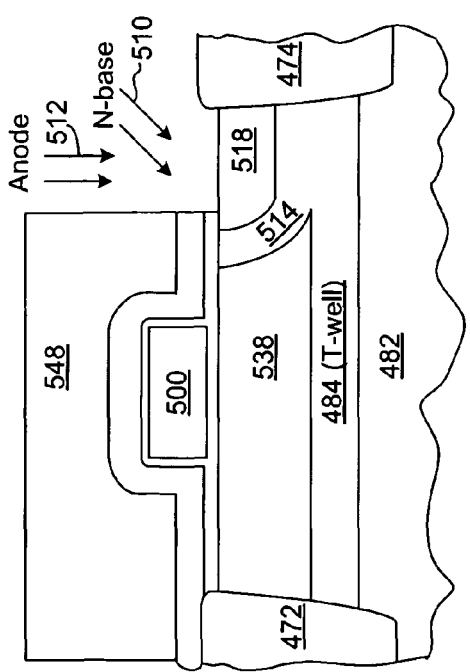
Fig. 13C
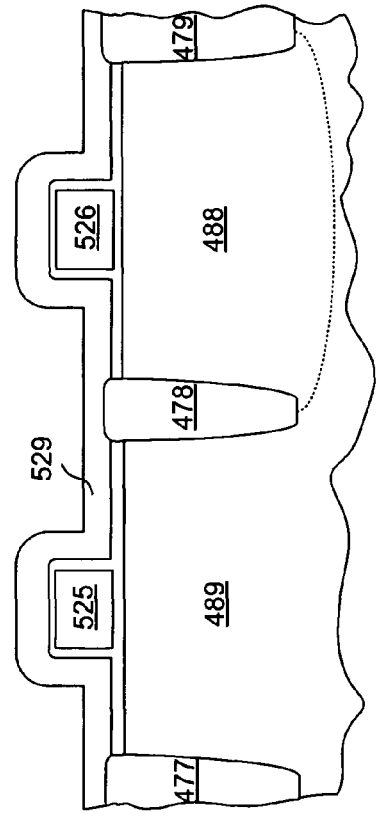
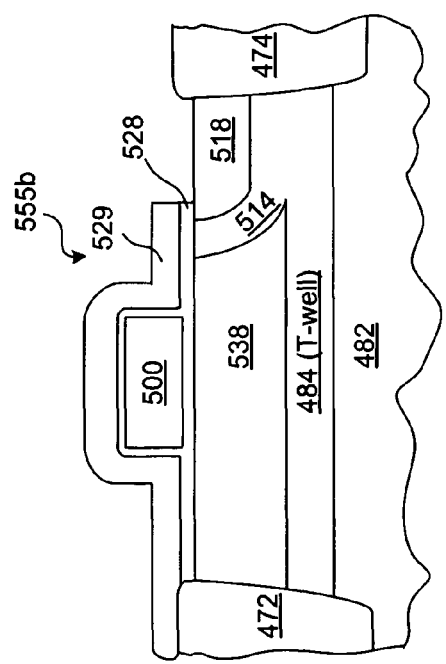
Fig. 13D

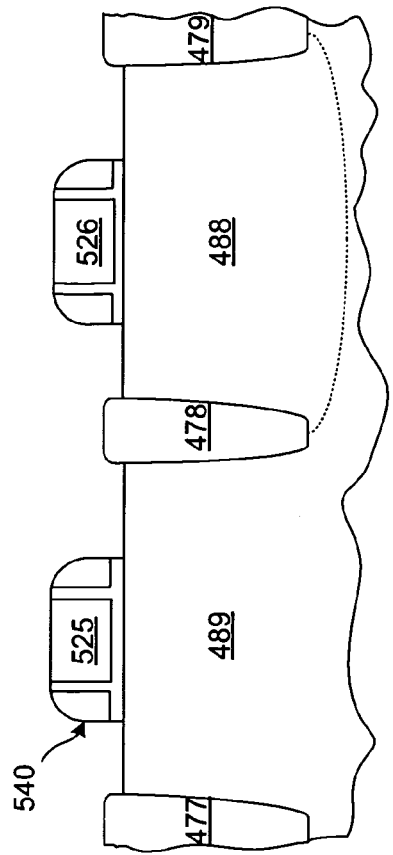
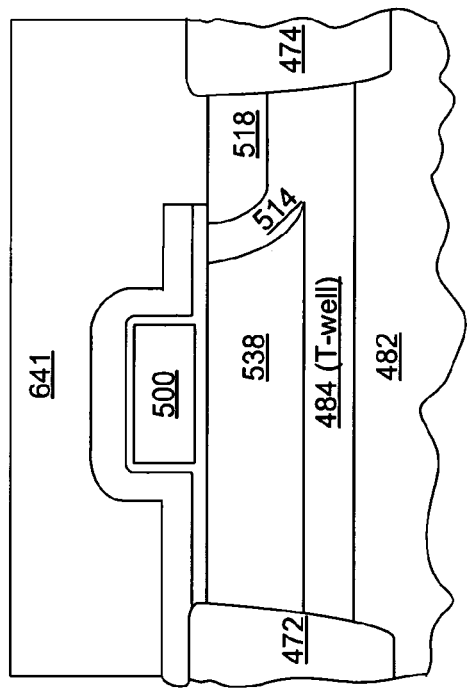
Fig. 13E
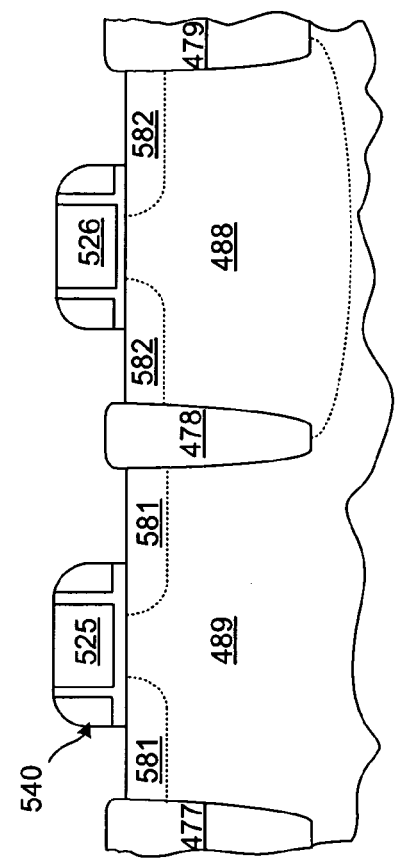
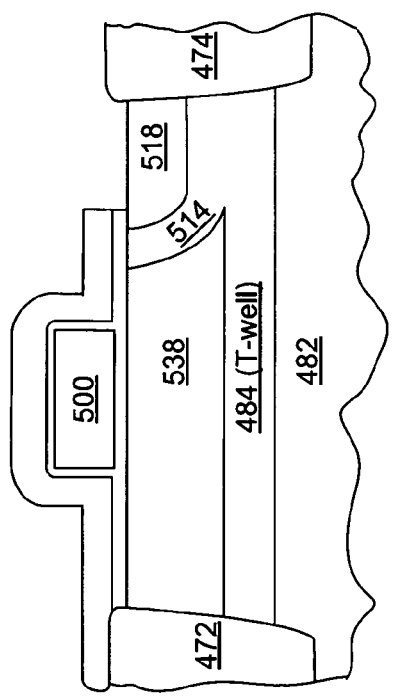
Fig. 13F

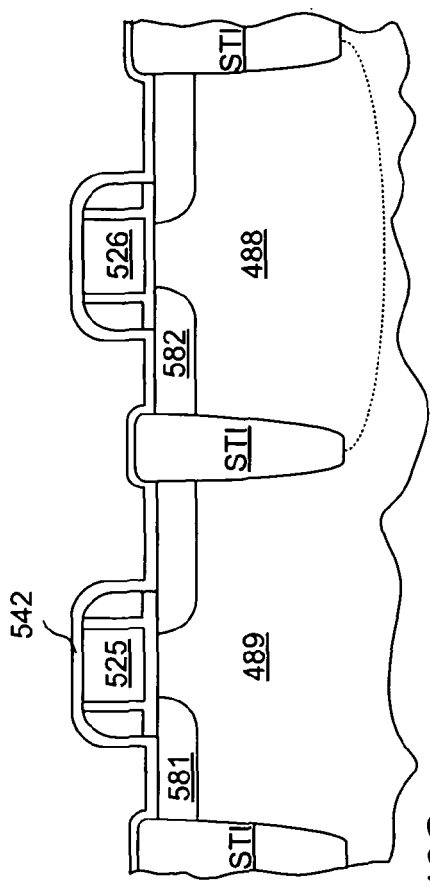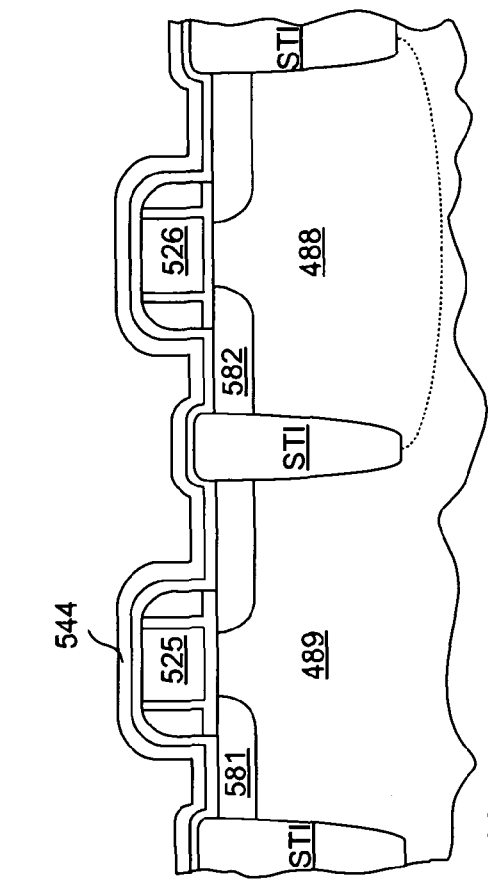
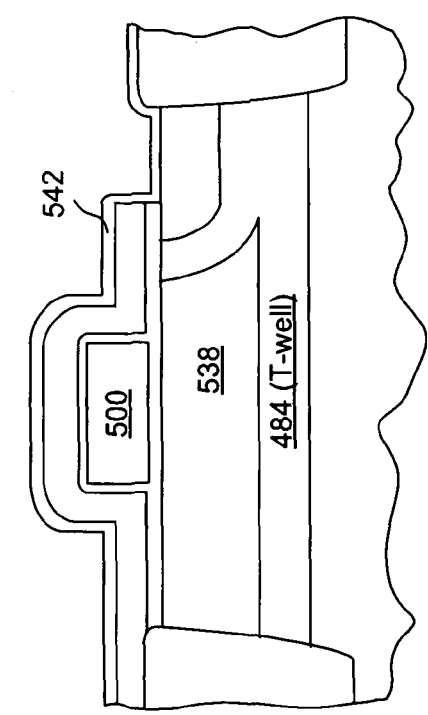
Fig. 13G
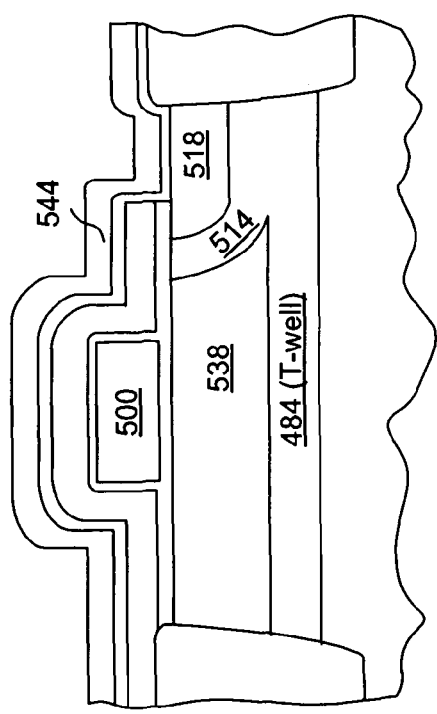
Fig. 13H

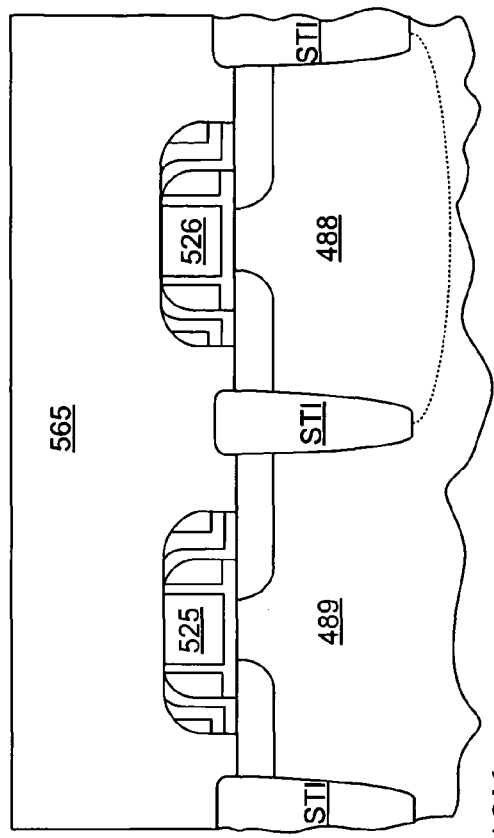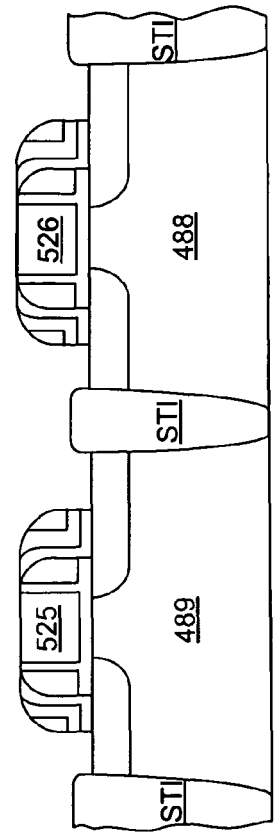
Fig. 13K
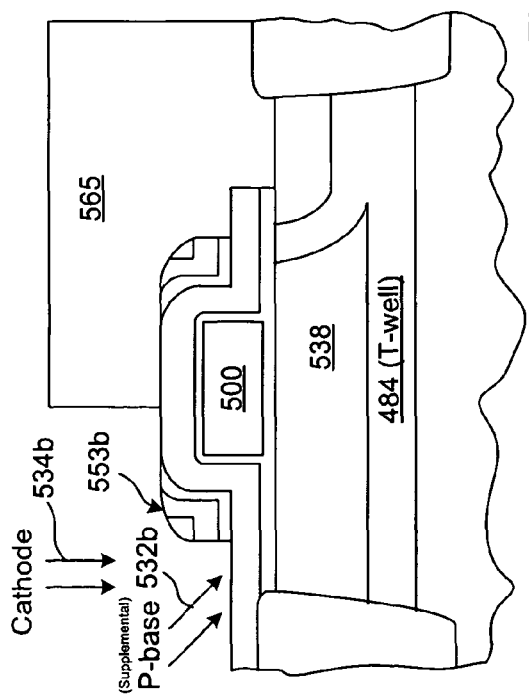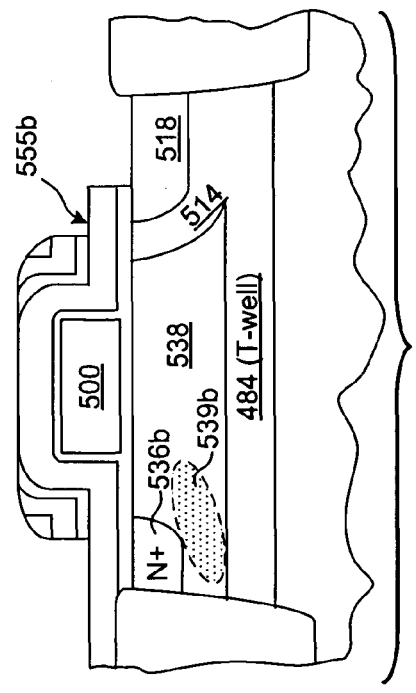
Fig. 13L

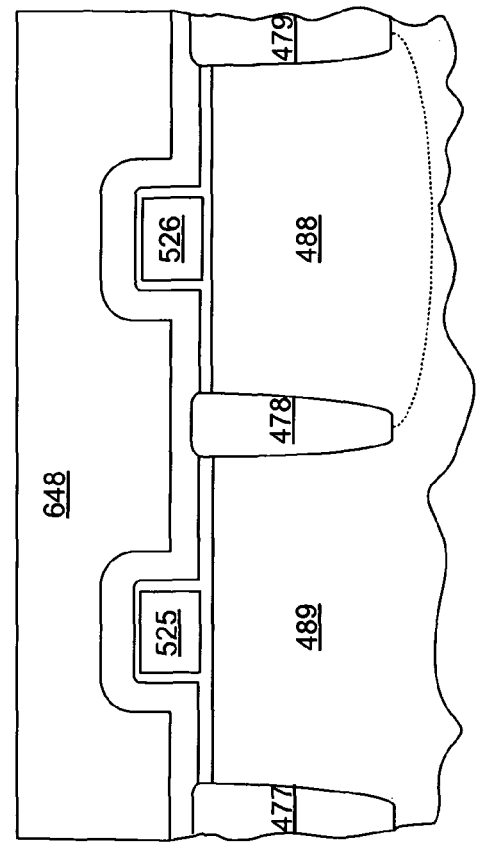
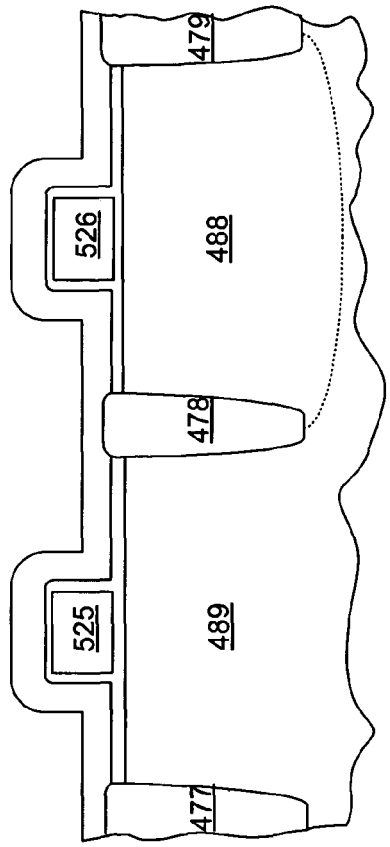
Fig. 14C
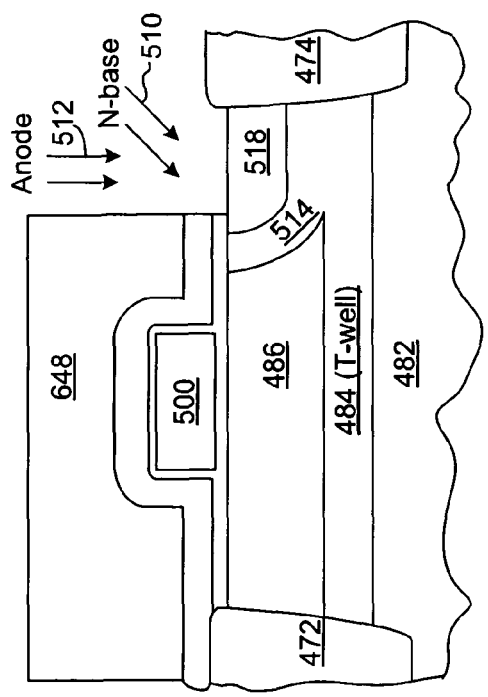
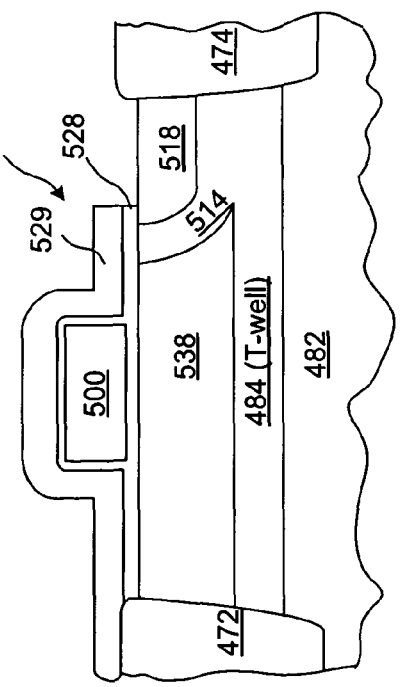
Fig. 14D

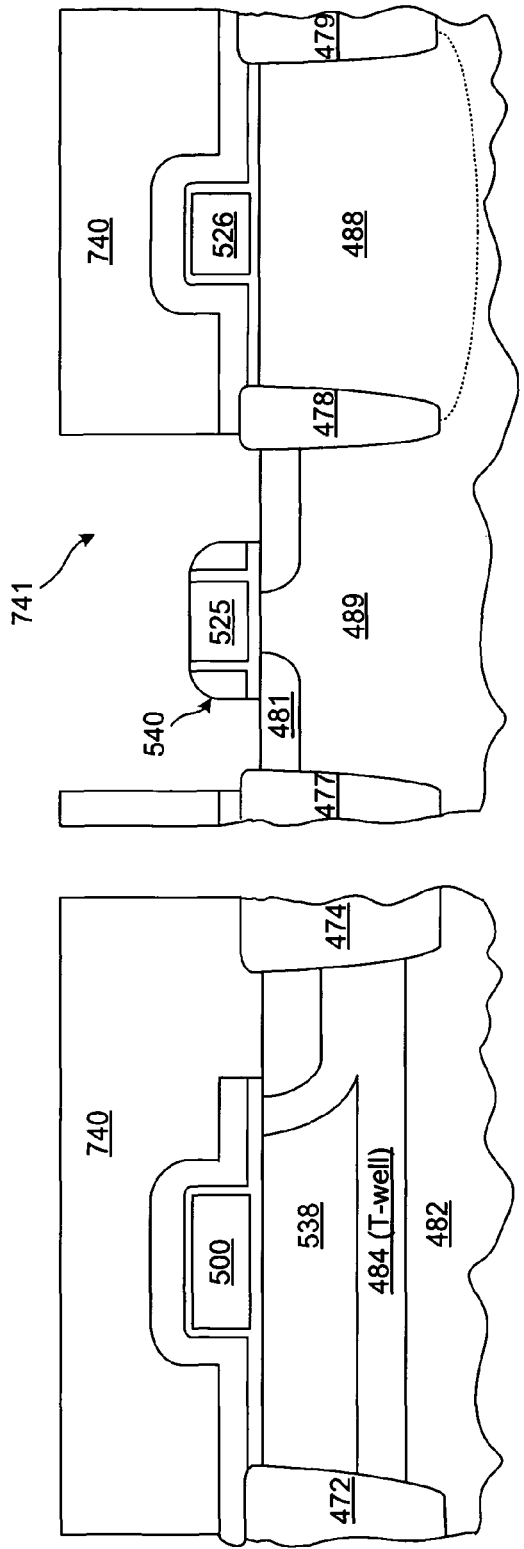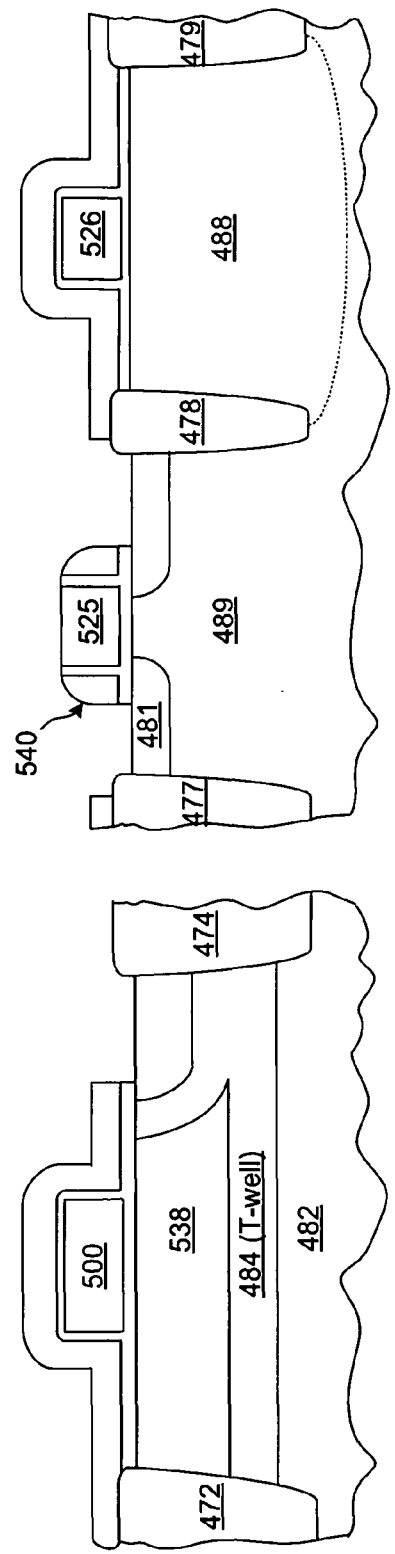
Fig. 14E
Fig. 14F

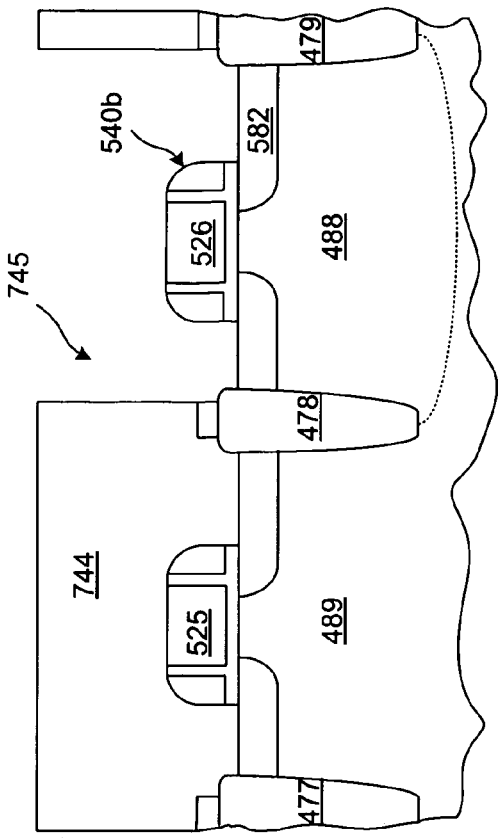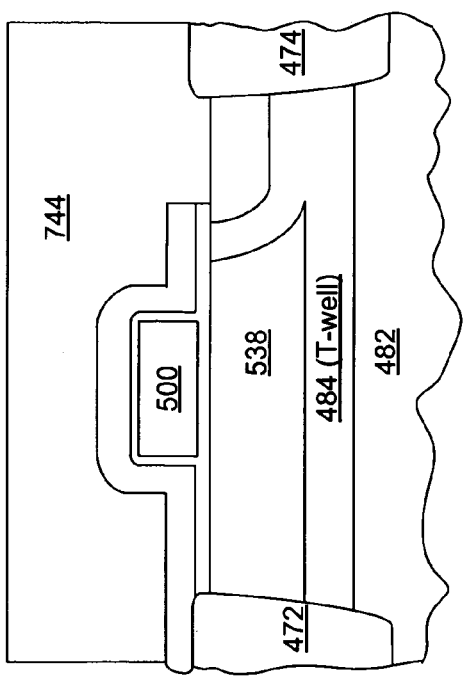
Fig. 14G
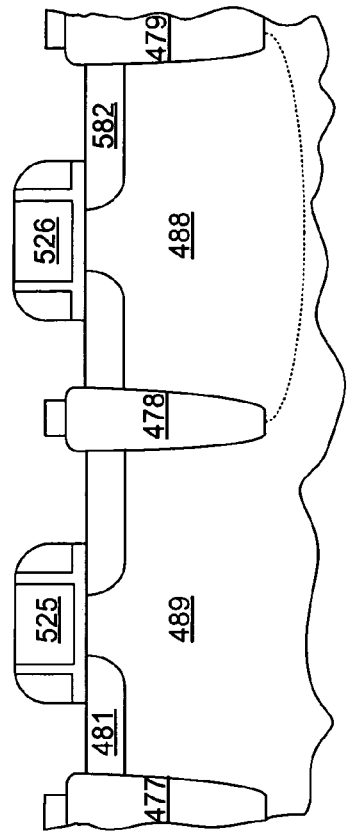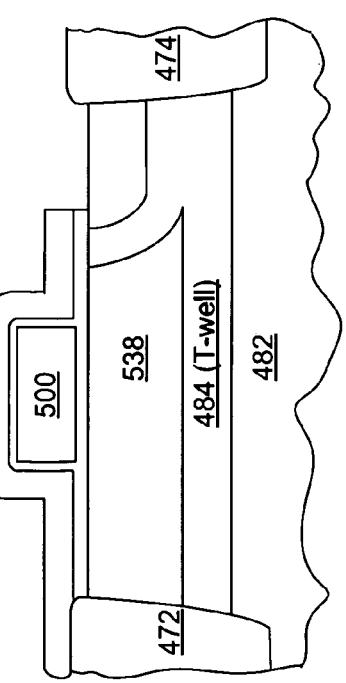
Fig. 14H

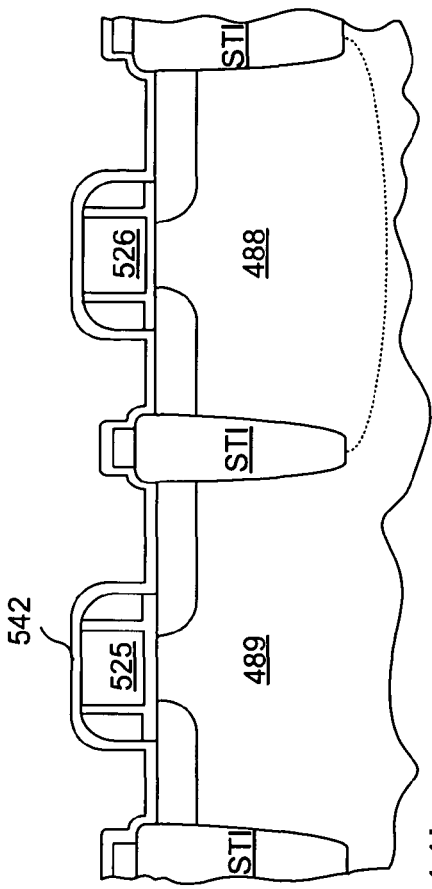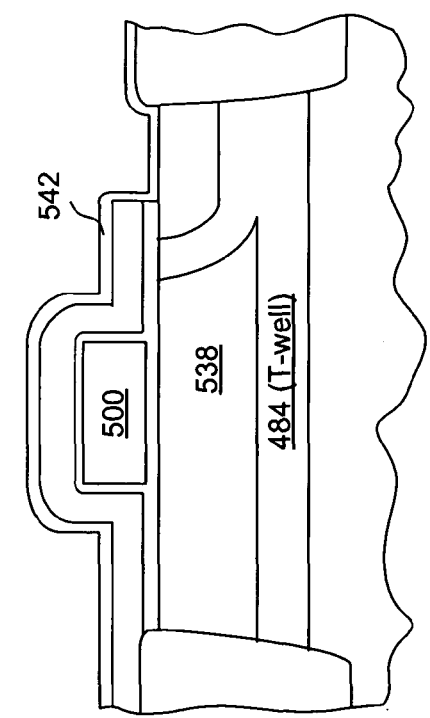
Fig. 14I
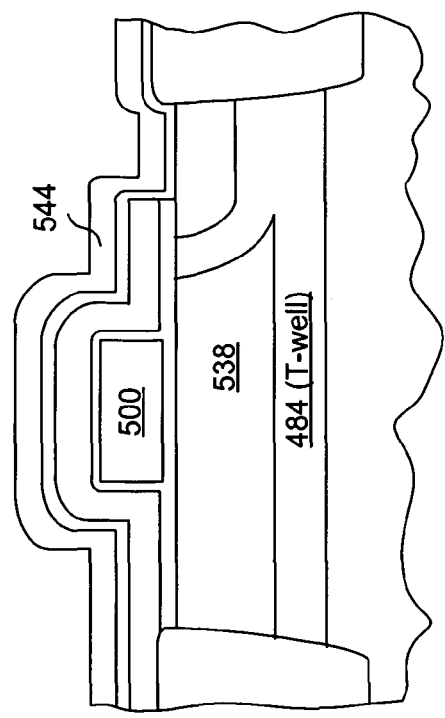
Fig. 14J

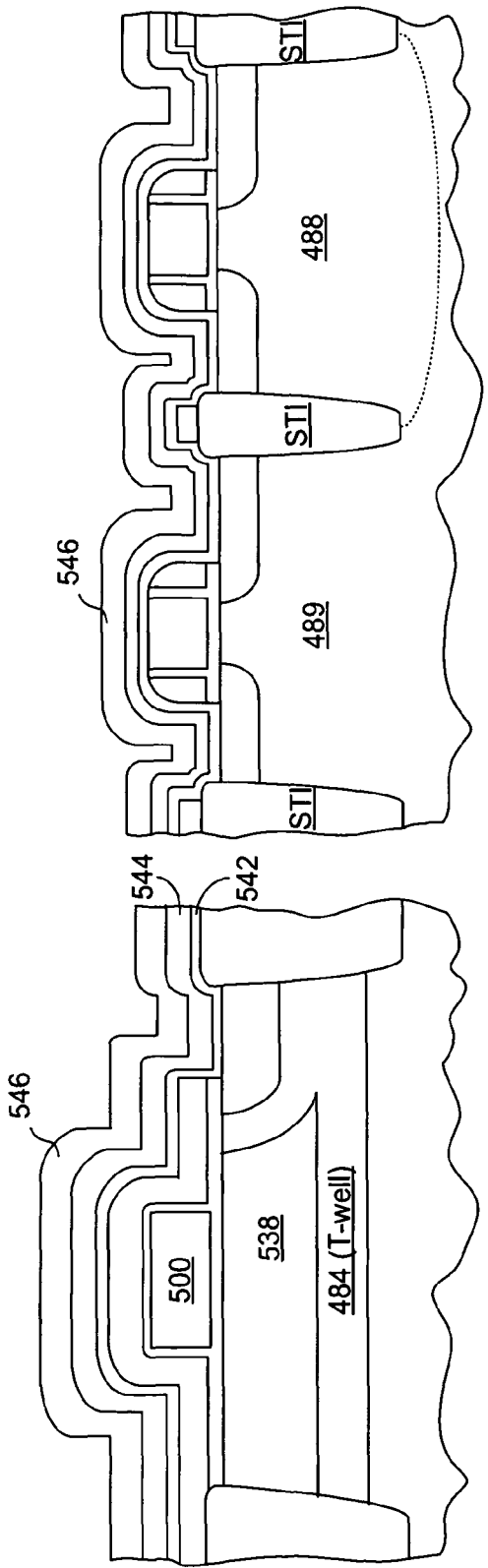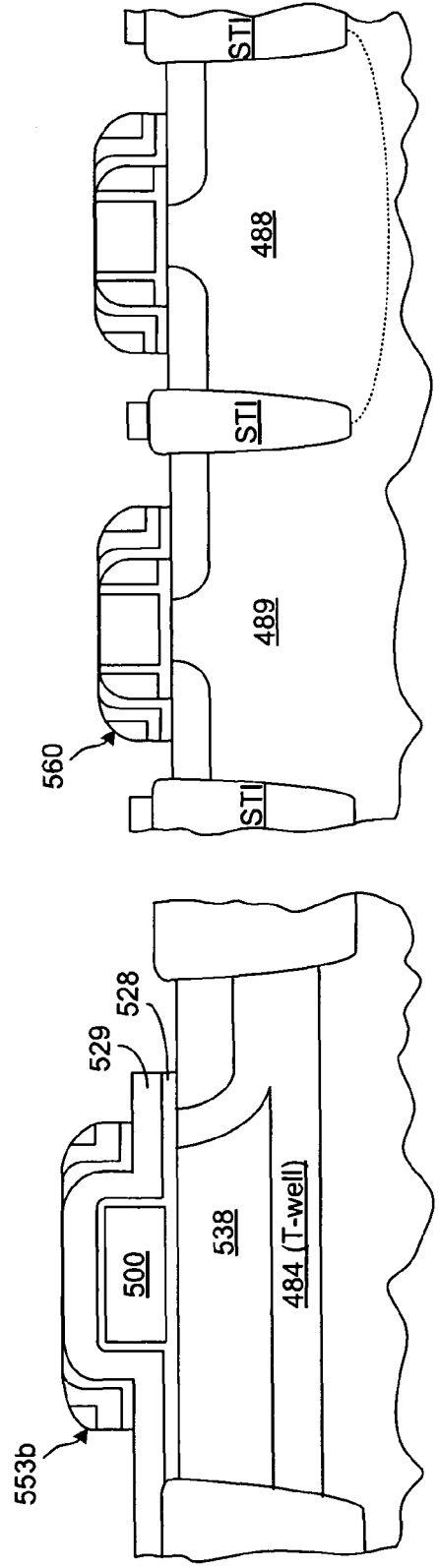
Fig. 14K
Fig. 14L

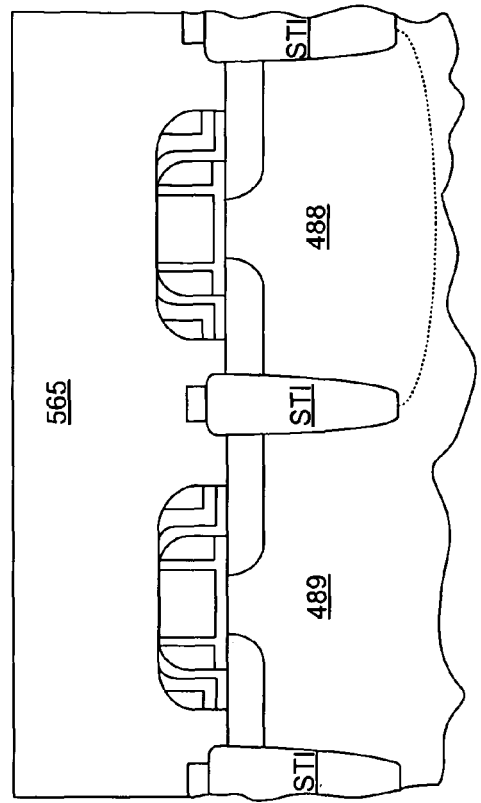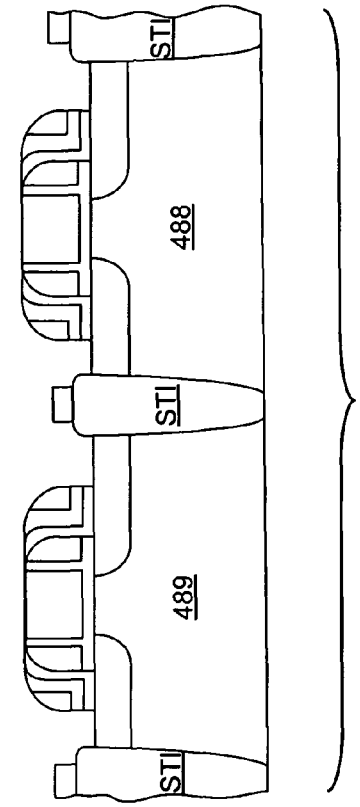
Fig. 14M
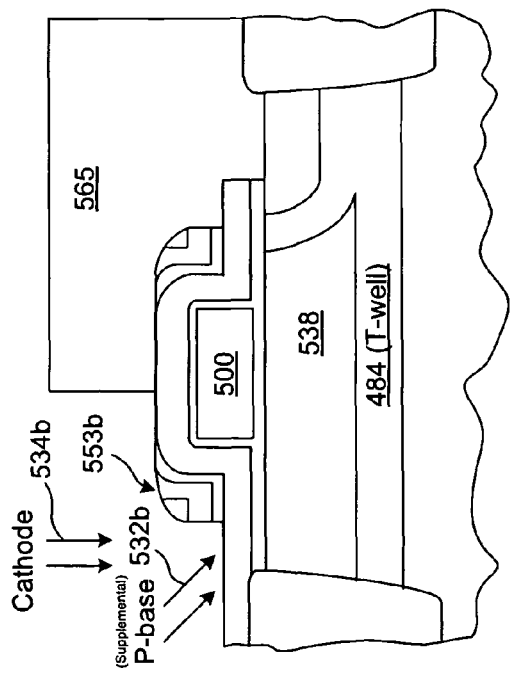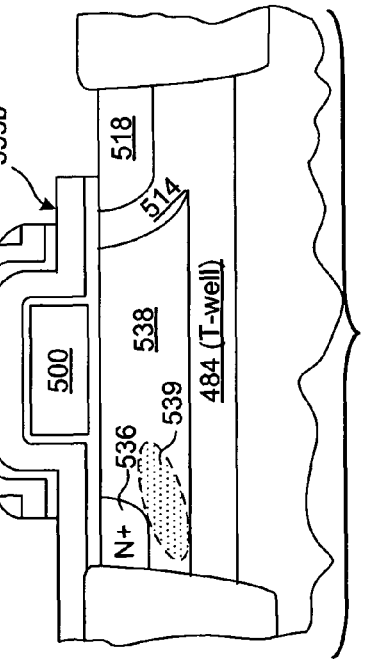
Fig. 14N

THYRISTOR SEMICONDUCTOR MEMORY AND METHOD OF MANUFACTURE

RELATED PATENT DOCUMENTS

This application is a continuation-in-part of U.S. application Ser. No. 11/881,159, filed Jun. 25, 2007, which is a continuation-in-part of application Ser. No. 11/159,447 filed Jun. 22, 2005. This application also claims benefit of U.S. provisional patent application Ser. No. 60/988,607 filed Nov. 16, 2007. All these patent applications are incorporated herein by reference.

BACKGROUND

The performance of logic has increased by two orders of magnitude over the past decade while the performance of memory has increased by less than a factor of two. Memory has become the critical bottleneck in most systems ranging from servers to routers to communications equipments. For example, the Internet revolution dramatically accelerated network performance requirements, but the technological limits of dynamic random access memory (DRAM) and static random access memory (SRAM) have created a bottleneck defined by the slow speed of DRAMs and the low density of SRAMs. System designers have struggled for years to find a solution that successfully matches the density of DRAM with the high speed of SRAM. Recently, a new kind of memory cell based on a breakthrough Negative Differential Resistance based (NDR-based) SRAM cell has been developed. It provides the best of both worlds: SRAM speeds paired with DRAM density. The result is a memory cell that is four times faster than existing DRAMs and four times denser than state-of-the-art SRAMs. More detailed information about such memory cell can be found in U.S. Pat. No. 6,229,161.

Although the above mentioned NDR based SRAM memory cell provides better size/performance over conventional SRAM and DRAM, there is a need to further improve the size/performance of memory.

SUMMARY

The present invention relates to a memory cell that has a thyristor and for embodiments implemented on a bulk silicon wafer. Although, only single thyristor memory cell embodiments are shown here, and absent an access transistor, the same thyristor structure can be extended to memory cells that include access transistors such as the thyristor based memory cell described in U.S. Pat. No. 6,229,161. In one embodiment, the thyristor is a thin capacitively coupled thyristor. A plurality of the new memory cells can be connected to word, bit, and control lines to form memory arrays.

In a further embodiment, a method of semiconductor fabrication includes forming a buried well of first conductivity in a substrate of semiconductor material of second conductivity, the buried well extending across a thyristor region. An electrode for a thyristor is formed over the region of semiconductor material for the thyristor while gates for MOSFETs are formed over MOSFET regions. Dielectric is formed conformally over the electrode and gates and photoresist is used to pattern and expose portions of the dielectric. Regions of the conformal dielectric are etched anisotropically through the windows of the patterned photoresist to form extension spacers against sidewalls of the gates for the MOSFETs. Another mask is then formed with a window over at least portions of the electrode for the thyristor. An implant of dopant for at least one of the anode region, a base region, or a cathode region to the thyristor is performed while using the window of the another mask to self-align the implant for the thyristor.

In a further embodiment, the extension spacers are formed from a stack of conformal oxide and nitride for the dielectric. Further, the another mask is formed by anisotropically etching additional dielectric that had been formed conformally over the previous dielectric stack. The anisotropic etch of the further dielectric may be stopped on the previously formed dielectric over at least select regions for the thyristor.

In yet a further embodiment, isolation trenches are formed in the semiconductor material by which to define (at least in part) a boundary to the thyristor region. In a further embodiment, at least one base region for the thyristor is formed with an inverted "T" shaped per a cross-section thereof. In such embodiment, the buried well forms the top cross-bar for the inverted "T" shaped structure of the base region.

In yet a further embodiment, the method of fabrication further includes implanting supplemental dopant into a portion of a base region that has been thinned and defined between the cathode region for the thyristor and the underlying buried well. For a device structure of this embodiment, the supplemental dopant provides a concentration of dopant sufficient to avoid depletion width exhaustion of carriers between the cathode region and the underlying buried well.

In yet a further embodiment, a thyristor based semiconductor device includes a thyristor having cathode, P-base, N-base and anode regions of semiconductor material disposed in electrical series relationship. An electrode is disposed in insulated, capacitively-coupled relationship to the P-base region. The electrode is further disposed in offset relationship with respect to the other N-base region so as to limit capacitive coupling with the N-base region. The N-base region of the thyristor is formed with a cross-section that defines an inverted "T" shape. The stem to the inverted "T" shape extends from a surface of the semiconductor material downwardly to a buried well. The P-base region for the thyristor extends laterally outward from a side of the stem, and is further bounded vertically between the buried well and a surface of the semiconductor material that is disposed beneath the electrode.

In yet a further embodiment, the thyristor based semiconductor device further includes a cathode region that is formed in a partial depth of the semiconductor material on a side of the electrode laterally opposite the anode. The cathode region defines, at least in part, a thinned portion of the P-base buried T-well.

In yet a further embodiment, the thyristor based semiconductor device further comprises supplemental dopant in the thinned portion of the P-base. The concentration of the supplemental dopant in the thinned portion of the P-base is greater than that associated with the other regions of the P-base. The concentration is further formed therein with level sufficient to operably affect a predetermined, enhanced forward break-over voltage characteristic for the thyristor.

In yet a further embodiment, a deep portion of the semiconductor material that is disposed beneath and that borders the buried T-well, includes dopant of a conductivity type that is opposite to that of the buried T-well. Additionally, isolation trenches may define at least a portion of a periphery to the thyristor with a trench depth in the semiconductor material that is greater than that of the buried T-well.

Advantages and features of embodiments of the present invention will be apparent from the following detailed description and accompanying drawings.

DESCRIPTION OF THE DRAWINGS

FIGS. 3A and 3B show signal diagrams for read operations of the present invention.

FIGS. 4A and 4B show signal diagrams for write operations of the present invention.

FIGS. 12A-12L are simplified cross-sectional views useful for describing a method of fabricating a semiconductor device in accordance with an embodiment of the invention, and showing formation of a thyristor together with peripheral MOSFETs over a substrate.

FIGS. 13A-13L are simplified cross-sectional views useful for describing a method of fabricating a semiconductor device in accordance with an embodiment of the invention, and showing formation of a thyristor together with MOSFETs and also showing where silicide may be patterned over an anode region for the thyristor.

DETAILED DESCRIPTION

In the following description, numerous specific details are set forth to provide an understanding of exemplary embodiments of the present invention, wherein similar elements between the various embodiments may be annotated similarly. Additionally, readily established circuits or elements of the exemplary embodiments may be disclosed in simplified form (e.g., simplified block diagrams and/or simplified description) to avoid obscuring an understanding the embodiments with excess detail Likewise, to aid a clear and precise disclosure, description of known structures—e.g., sidewall spacers, gate oxides, conductive lines, voltage sources, contacts, vias, etc.—may similarly be simplified where persons of ordinary skill in this art can readily understand such structures and provisions by way of the drawings and present disclosure.

Further, it may be understood that the polarity of P and N-type materials for particular examples could be reversed in some embodiments; wherein one embodiment making reference to cathode, P-base, N-base and anode regions might therefore via an alternative polarity embodiment be representative of anode, N-base, P-base and cathode regions respectively.

Figure 1A:
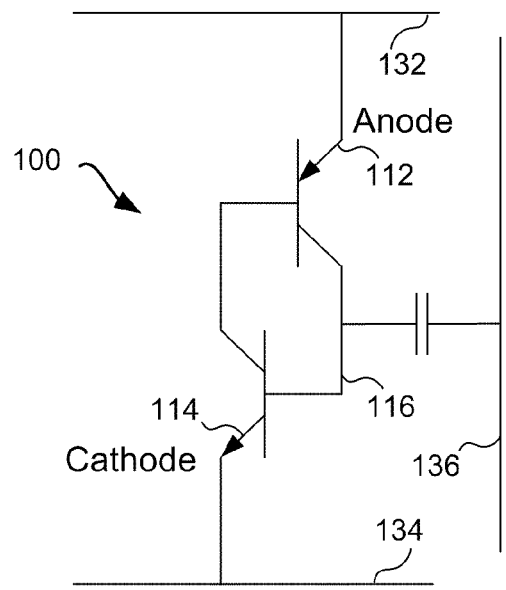
FIGS. 1A and 1B show an exemplary capacitively coupled thyristor memory cell of the present invention.

FIG. 1A is a schematic diagram of a capacitively coupled thyristor memory cell 10 of the present invention. It comprises an anode 112, a cathode 114 and two bases, one of which is labeled 116. Anode 112 is connected to a bit line 132, cathode 114 is connected to a word line 134, and base 116 is capacitively connected to a control (wordline2) line 136.

Figure 1B:
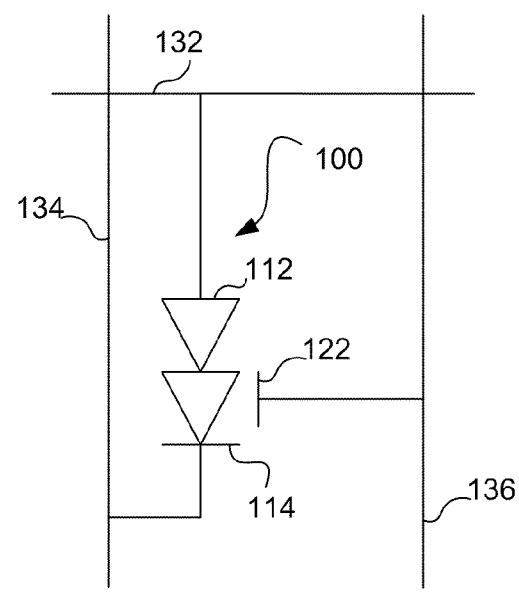

FIG. 1B is another version of a schematic diagram of the thyristor memory cell 100 shown in FIG. 1A. It shows the anode 112, cathode 114, gate 118, bit line (BL) 132, word line (WL) 134 and wordline2 (WL2) line 136.

Figure 1C:
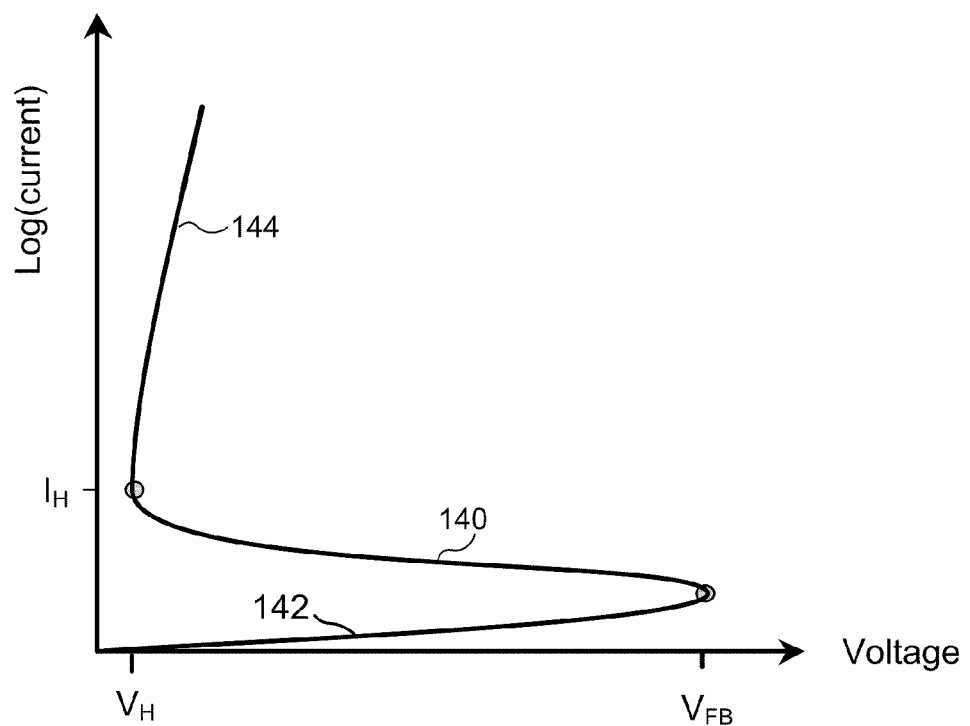
FIG. 1C shows a current-voltage graph of a thyristor of the present invention.

FIG. 1C is a graph 140 illustrating the current-voltage DC characteristics of a thyristor device of the present invention. It has a non-conducting state 142. Upon application of a voltage larger than a forward blocking threshold voltage VFB, the thyristor may abruptly transition to a conducting state 144. The thyristor stays at conducting state 144 while the current and voltage of the base regions drop slowly. When its current drops below a holding current IH (corresponding to a holding voltage VH), the thyristor may abruptly transition to non-conducting state 142.

Figure 2:
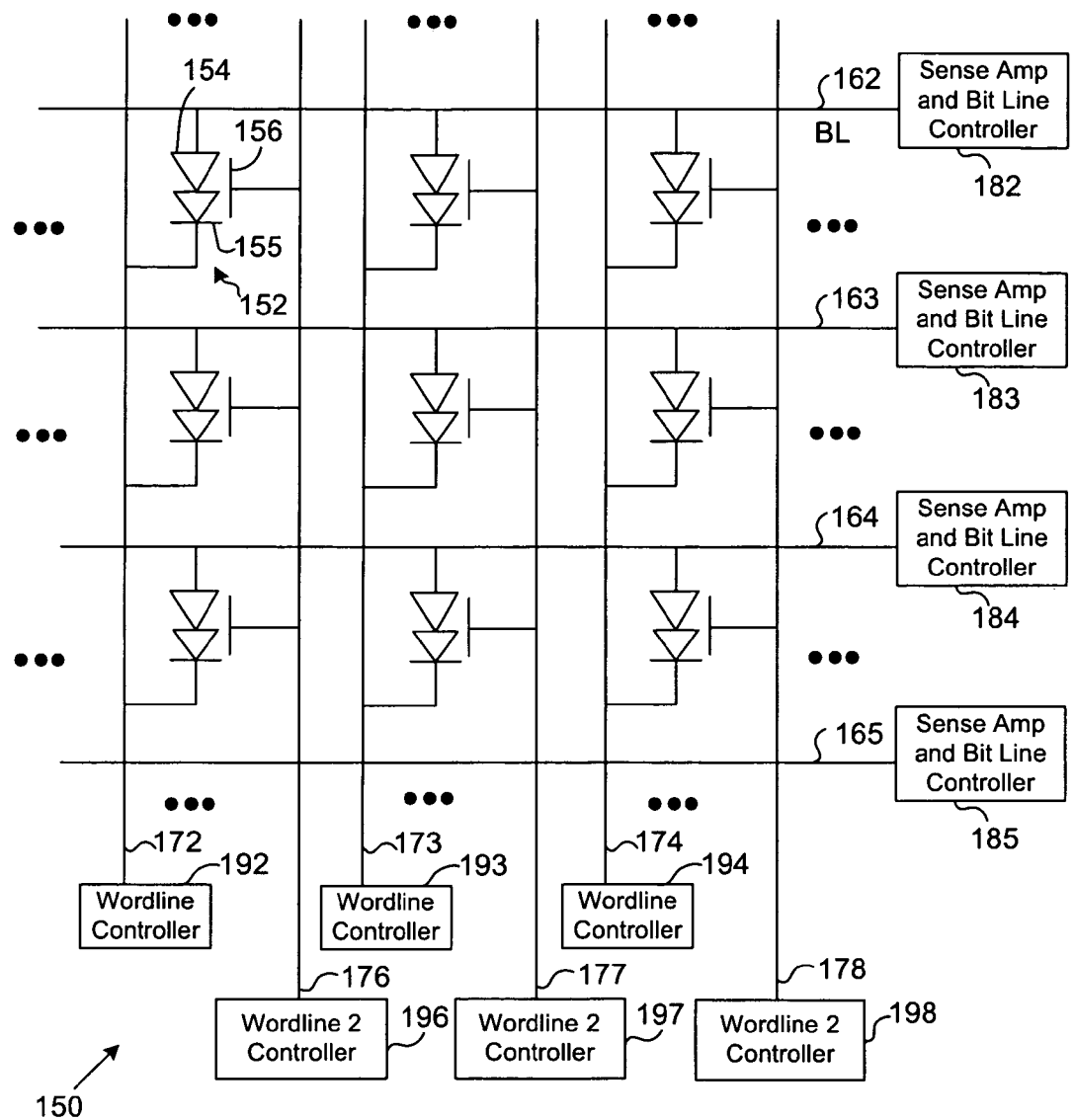
FIG. 2 is a schematic diagram of a portion of an exemplary memory array of the present invention.

A memory array can be formed using the thyristor memory cell of FIG. 1A. FIG. 2 shows a portion of an exemplary array 150 of the present invention. In FIG. 2, only three rows and three columns of thyristors are shown. It should be noted that the present invention is not restricted to any number of rows and columns. An exemplary thyristor 152 is described here. It has an anode 154, cathode 155 and gate 156 connected to a bit line 162, a word line 172 and a wordline2 line 176, respectively. FIG. 2 also shows other bit lines 163-165, other word lines 173-174 and other wordline2 lines 177-178.

In order to operate the array, a plurality of sense amplifier and bit line controllers 182-185, a plurality of word line controllers 192-194 and a plurality of wordline2 controllers 196-198 are used. These controllers provide the proper signals to various bit, word and wordline2 lines at appropriate times. The sense amplifiers are used to determine the data stored in the thyristors. Detailed description of the signal amplitude and timing at various lines of array 150 is provided below.

When a cell is in standby mode, there is no read, write or restore activities. An exemplary voltage arrangement at standby can be: (a) BL is set at 1.2V, (b) WL2 line is set at −2V, and (c) WL is set at 1.2V. It should be noted that the standby voltages of BL and WL do not need to be the same, although the voltage different between BL and WL is preferably less than VFB. Also note that the standby voltages of WL2, BL and WL can be positive or negative.

FIGS. 3A and 3B are signal diagrams for a read operation of the present invention when the data is at a "0" state and a "1" state, respectively. These states correspond to the two states of a thyristor: blocking and conducting. For illustrative purposes in the present disclosure, a "0" corresponds to blocking state and a "1" correspond to conducting state. In one embodiment, the WL2 line of the selected cell is pulsed from its standby voltage 202 to a higher voltage 203 and the WL of the selected cell is pulled from the standby voltage 204 to a lower voltage 206. Both WL2 and WL return to their standby voltages near the end of the read cycle. The voltage of the BL (originally at standby 208) is sensed after WL2 and WL changed from their standby voltages. If the voltage of BL remains substantially the same, then the state is "0" (see FIG. 3A). If the voltage of BL decreases 210, then the state is "1" (see FIG. 3B). Before the end of the read cycle, the voltage of BL returns to the standby level. Note that the return timing of WL2, WL and BL can be independent of one another.

Either voltage or current sensing can be used in read operations. In a current sensing scheme, the change in the BL voltage is typically smaller than voltage sensing. Thus, the sense amplifier senses flow of current or the impedance of the BL. If the thyristor is in a blocking state, the current sense amp sees a high impedance or a low current on the BL. If the thyristor is in a conducting state, the current sense amp senses a low impedance or a high current.

FIG. 4A shows signal diagram for write "0" operation of the present invention. In one embodiment, the BL and WL of the selected cell are pulled from their respective standby voltages (230 and 222) to a lower voltage 232 and 225, respectively. In one embodiment, voltage 232 of BL minus voltage 225 of WL is to be low enough so that the potential of one of the base regions can be substantially modulated by the WL2 line. The WL2 line is pulsed to a higher voltage 229 (either before or after the voltage change of BL and WL). In one embodiment, voltage 229 is higher than the standby voltage by more than about 1V. However, voltage 229 can be higher than the standby voltage by a value ranging from 0.5V to 5.0V. After the WL2 line returns to its standby voltage, the BL and WL return to their standby voltages.

FIG. 4B shows signal diagrams for write "1" operation of the present invention. In one embodiment, the WL of the selected cell is pulled from the standby voltage 222 to a lower voltage 224, and will return to the standby voltage near the end of the write cycle. The WL2 line is pulsed from the standby voltage 226 to a higher voltage 228 (either before or after the rising edge of the WL) and then returns to the standby voltage. In one embodiment, this higher voltage is higher than the standby voltage by more than about 1V. However, voltage 228 can be higher than the standby voltage by a value ranging between 0.5V and 5.0V. For a "1" is to be written to the selected cell, the BL remains at the standby voltage 234 throughout the write cycle.

The signal diagrams illustrated in FIGS. 3A-3B and 4A-4B can be easily implemented by sense amp and bit line controllers 182-185, word line controllers 192-194, and wordline2 controller 196-198.

The data retention and power consumption of the memory array 150 of the present invention can be improved by periodically refreshing the memory cells. Refresh is one method for maintaining data in the memory cells. The data in a cell selected for refresh is read and then written back to the cell. In a refresh operation, a sense amplifier needs to be used to read the data. Word line and wordline2 controllers are used to write back the data. The refresh operation can be applied approximately once every 0.01 to 10,000 milliseconds.

Another method to maintain data in the memory cells of memory array 150 is by periodically restoring the state of the memory cells. One of the states of a thyristor (e.g., "1") can gradually transition to another state (e.g., "0") during standby. However, data in the thyristor can be self-restored by periodically pulsing at least one of the three lines connected to the thyristor. There is no need to involve the sense amplifier or perform read/write operations. In one embodiment of the present invention, the restore operation involves periodically pulsing the word lines of array 150 from the standby voltage to a lower voltage. The pulse width can vary from 0.1 ns to 10 ns. The time interval between restore pulses can vary from 0.01 ms to 500 ms. Background information about restore operation can be found in U.S. Pat. No. 6,885,581 titled "Dynamic data restore in thyristor based memory device." This patent is incorporated herein by reference. The restore operation can be easily implemented by word line controllers 192-194.

Figures 5A, 5B:
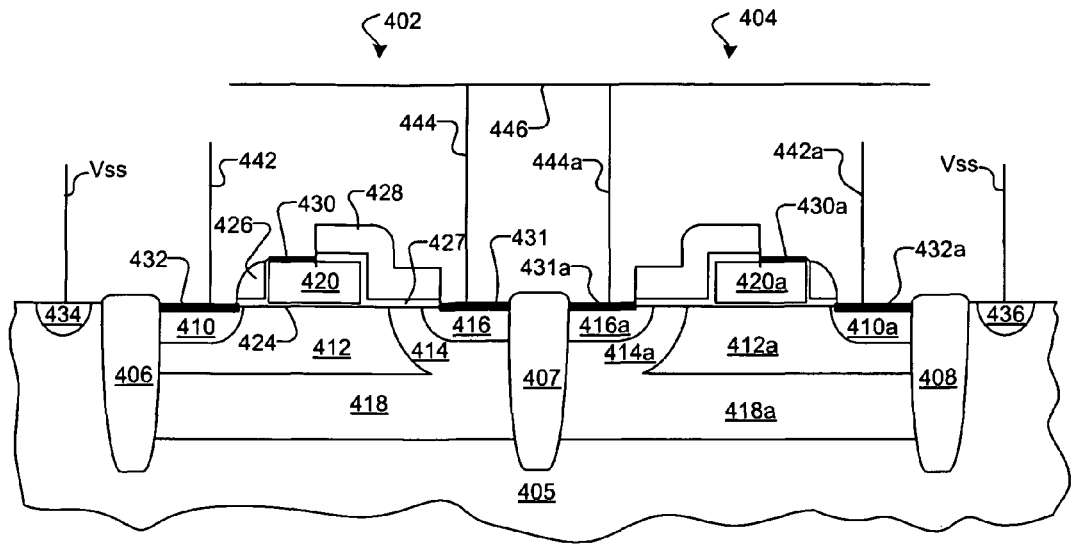
FIG. 5A is a diagram showing the cross section of two adjacent memory cells of the present invention.
FIG. 5B is a schematic diagram explaining reduction in adjacent bit disturb based on an embodiment of the present invention.

Several embodiments of single thyristor memory cells implemented on a bulk silicon wafer will now be described. FIG. 5A shows a cross sectional view of one embodiment. Only two exemplary capacitively coupled thyristor memory cells (402 and 404) are shown. These two cells and other memory cells (not shown) in a memory array are fabricated on a P type substrate 405 ("P-sub"). Cells 402 and 404 are separated from each other and the other memory cells by oxide isolation or shallow trench isolation ("STI") regions 406-408. The structure of these cells are substantially identical, thus only one of the cells (e.g., cell 402) is described in detail. Cell 402 comprises a thyristor body having an N+ region 410, P-base region 412, N-base region 414 and P+ region 416. The thyristor body sits on top of an N-well 418. A control gate 420 is deposited on top of a gate dielectric 424, which is deposited on top of P-base 412. Spacer materials 426-428 may be formed adjacent to control gate 420. Salicide regions 430-432 are formed on top of control gate 420, P+ region 416, and N+ region 410, respectively, in areas not covered by spacer materials 426-428. In one embodiment, memory cell 402 is approximately 1.5 μm wide, including half the width of a STI trench on each side.

Memory cells 402 and 404 can be used in a memory array. For illustration purposes, some of the components of memory cell 404 are assigned reference numerals that are the same as the corresponding components of memory cell 402 with the letter "a" attached at the end. N+ region 410 of cell 402 can be connected to a word line 442 through salicide region 432. Similarly, N+ region 410a of cell 404 can be connected to a word line 442a through salicide region 432a. Salicide region 431 and 431a can be connected to the same bit line 446. Salicide region 430 can be connected to a wordline2 line (not shown). Similarly, salicide region 430a can be connected to another wordline2 line (not shown).

FIG. 5A also shows a P+ tap connection region 434. This region is connected to a supply low voltage Vss (typically at ground). One P+ tap connection region can be used for several memory cells (e.g., 8, 16, etc.). For illustrative purpose, tap connection region 434 is associated with memory cells 402 and 404 while another P+ tap connection region 436 is used to support two memory cells (not shown) to the right of region 436. Region 436 is also connected to voltage Vss.

One advantage of the embodiment shown in FIG. 5A is that it has a low adjacent bit disturb risk. Adjacent bit disturb refers to the undesirable situation when data in one memory cell is disturbed (a "victim cell") as a result of reading data in an adjacent memory cell (an "aggressor cell") along the same word or bit line. FIG. 5B shows a schematic diagram of two memory cells of the type described in FIG. 5A along the same word line (which may correspond to memory cell 402 and a cell behind it along the same word line 442). One of the cells is an aggressor cell and the other cell is a victim cell. Both cells are located on the same P-sub (i.e., reference numeral 405 in FIG. 5A). As a result, FIG. 5B shows that that the aggressor and victim cells share the same P-sub node 452 and word line node 454. The schematic diagram in FIG. 5B also shows a resistor 456 to depict the resistance between P-sub and a P+ tap connection region.

In a thyristor based memory cell, injection of holes into the P-base of a victim cell can charge the P-base. This may induce the victim cell to change its state because P-base is a storage node. When data is read from the cells in the schematic of FIG. 5B, a voltage kick is applied to the gates 457, 458 (which correspond to wordline2 of the respective cells) and the common word line 454 is pulled to ground (see FIGS. 3A and 3B). Although the voltage of P-sub may rise above ground due to the presence of resistor 456, injection of holes from P-sub into P-base will only be effective if the N-well bias is sufficiently below the voltage of the P-sub. However, the bitline to N-base/N-well diode will be effective in charging the N-base/N-well to near a supply high voltage VDD, so such injection from P-sub to P-base is inhibited. As a result, the adjacent bit disturb risk is reduced.

Figure 6A:
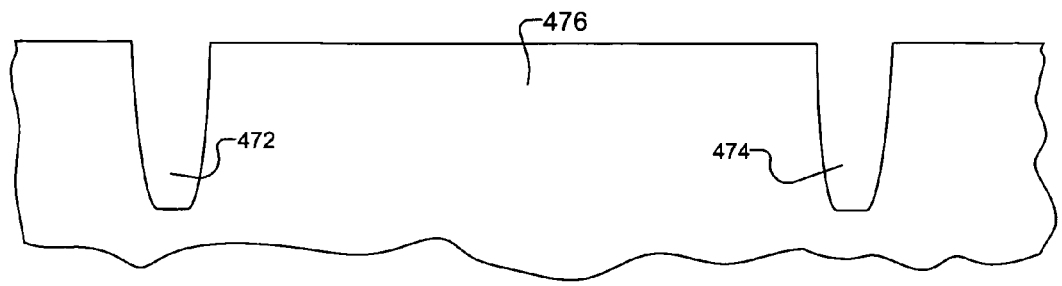
FIG. 6A-I show the cross section of various steps in the fabrication of the embodiment in FIG. 5A.

One way to fabricate the memory cells 402 and 404 is shown in FIGS. 6A-6I. For simplicity, the details of fabricating one cell are shown. In FIG. 6A, a plurality of trenches, such as trenches 472 and 474, are formed on a lightly doped P-type silicon 476 (e.g., dopant concentration of about $10^{15}$ $cm^{-3}$). The trenches are then filled with an insulating material such as oxide. Trenches 472 and 474 correspond to STI regions 406 and 408, respectively, of FIG. 5A. In one embodiment, the trenches are about 0.4 µm deep and 180 nm wide at the top. A layer of screen oxide 480 is then grown on the top surface of the silicon (see FIG. 6B). In one embodiment, the thickness of screen oxide 480 is about 10 nm. A deep P-type implant, an N-type implant, and a shallow P-type implant are used to form a deep P-well 482 near the bottom of the trenches, an N-well 484 in the middle, and a top P-well 486. For the deep P-well, a boron implant having a dosage of $4 \times 10^{13}$ $cm^{-2}$ and energy of 260 KeV can be used. For the N-implant, an arsenic implant having a dosage of $2 \times 10^{13}$ $cm^{-2}$ and energy of 450 KeV can be used. For the top P-implant, a boron implant having a dosage of $1 \times 10^{13}$ $cm^{-2}$ and energy of 15 KeV can be used. In one embodiment, top P-well 486 and N-well 484 are approximately 100 nm thick. Screen oxide layer 480 can then be removed. The formation of a gate stack is now described (which corresponds to control gate 420 and gate oxide 424 of FIG. 5A). A gate dielectric (e.g., $SiO_2$) layer 490 is grown on top P-well 486 (see FIG. 6C). In one embodiment, the thickness of layer 490 is about 3 nm. A layer 492 of gate electrode material (e.g., deposit polysilicon) is formed on layer 490. In one embodiment, the thickness of layer 492 is about 150 nm. As an optional step, non-thyristor regions of the silicon are masked off and a P-type dopant (e.g., boron) is implanted in the gate electrode material. Examples of non-thyristor regions are regions for sense amplifiers and word line controllers.

Figure 6B:
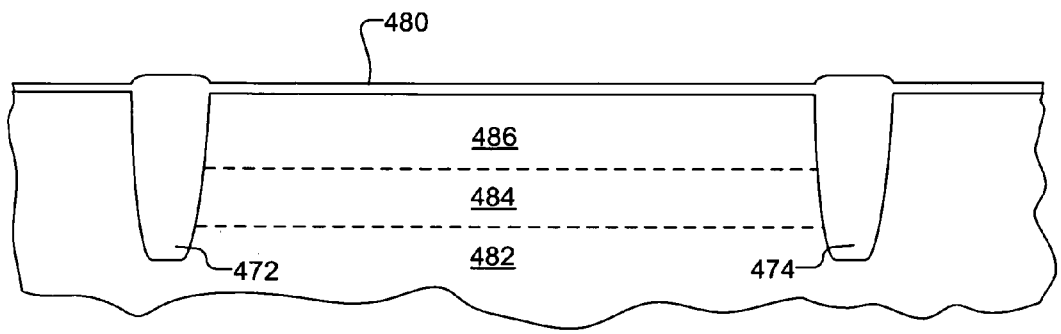
Figure 6C:
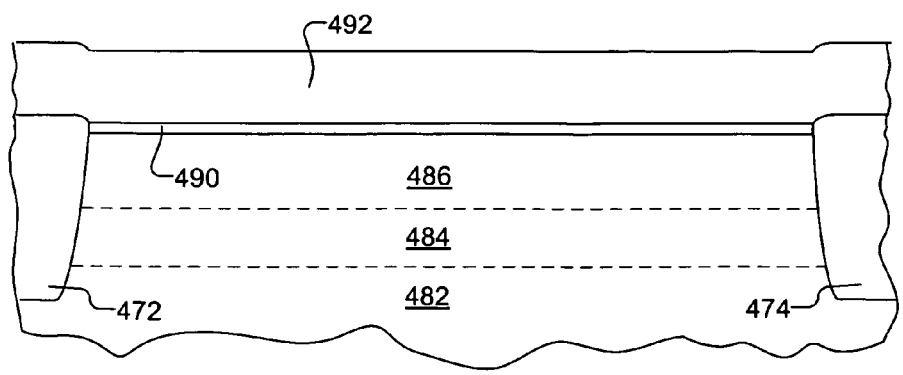
Figure 6D:
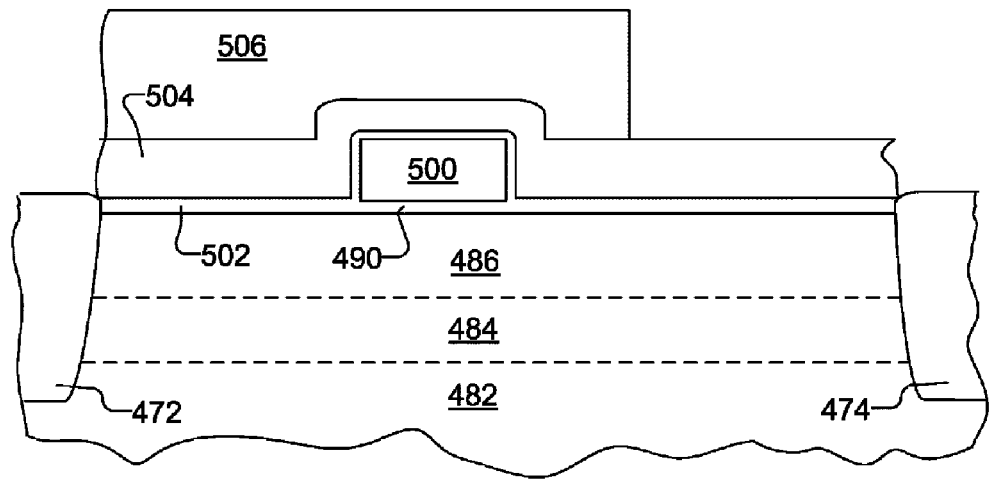
Figure 6E:
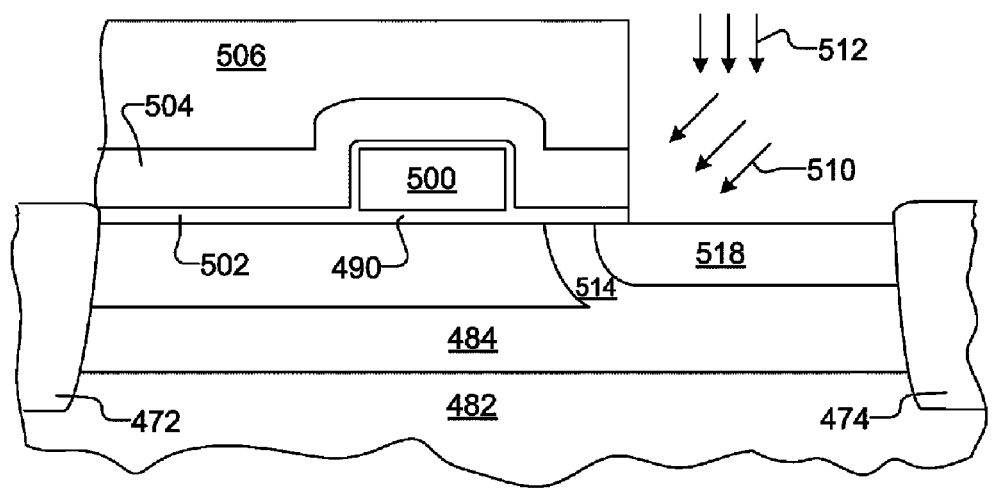
Figure 6F:
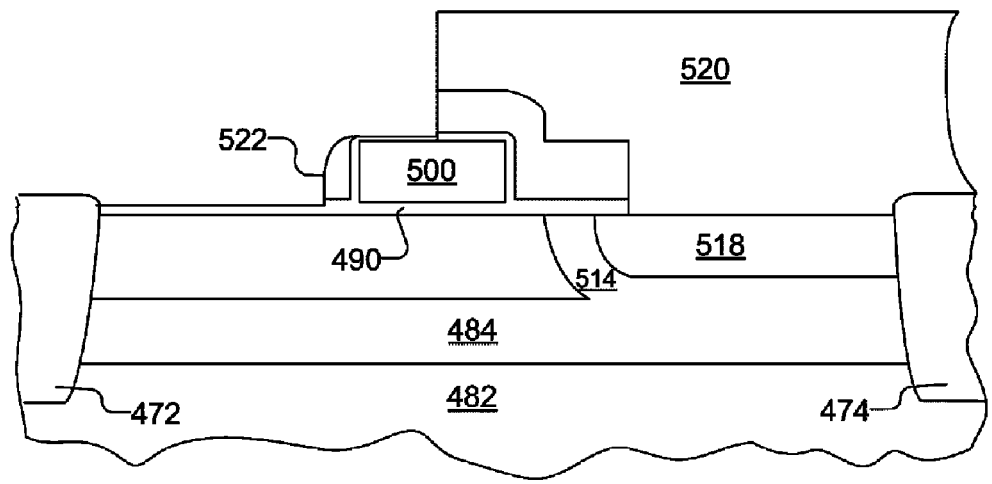

The device of FIG. 6C is then patterned to form a control gate 500 on gate oxide 501 (see FIG. 6D). Spacer material is deposited on top of P-well 486. In one embodiment, a nitride 502 and oxide 504 stack is deposited. The oxide layer can be a few nm thick and the nitride layer can be tens of nm. A photoresist 506 is deposited to define an opening for forming an anode region of the thyristor.

The spacer material at the opening is etched. An angle implant 510 of N-type dopant is used to create an N-base region 514 (see FIG. 6E). A substantially vertical implant 512 of P-type dopant is used to create a P-type anode region 518. In one embodiment, anode region 518 is approximately 100 nm deep and 0.5 µm wide while N-base region 514 is approximately 100 nm wide at the top surface of silicon. A description of anode formation is provided in U.S. Pat. No. 6,767,770 title Method of Forming Self-Aligned Thin Capacitively-Coupled Thyristor Structure, which is incorporated herein by reference. An optional carbon implant can also be performed.

Carbon implant is described in U.S. Pat. No. 7,075,122 titled Thyristor Device with Carbon Lifetime Adjustment Implant and Its Method of Fabrication, which is incorporated herein by reference.

Figure 6G:
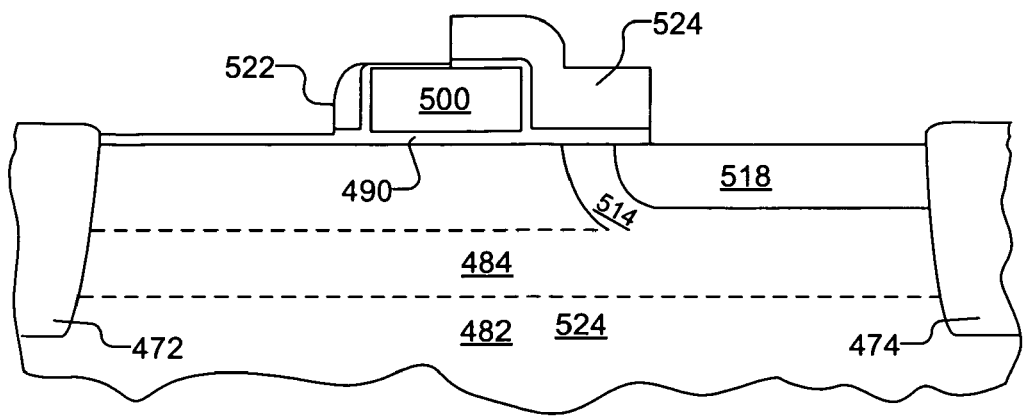
Figure 6H:
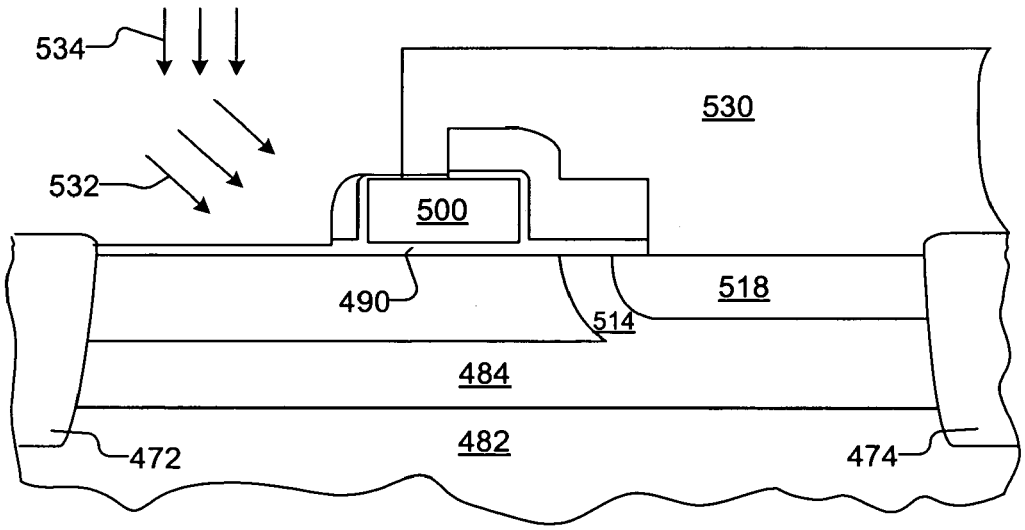

Photoresist 506 is stripped. A new photoresist 520 is deposited to define another opening (see FIG. 6F). This opening covers the cathode region of the thyristor and also regions that are not part of the thyristor. The spacer material that is not protected by photoresist 520 is etched. Etching of spacer material is described in above-mentioned U.S. Pat. No. 6,767, 770. FIG. 6G shows the structure after photoresist 520 is stripped. Control gate 500 is surrounded by spacers 522 and 524.

Figure 6I:
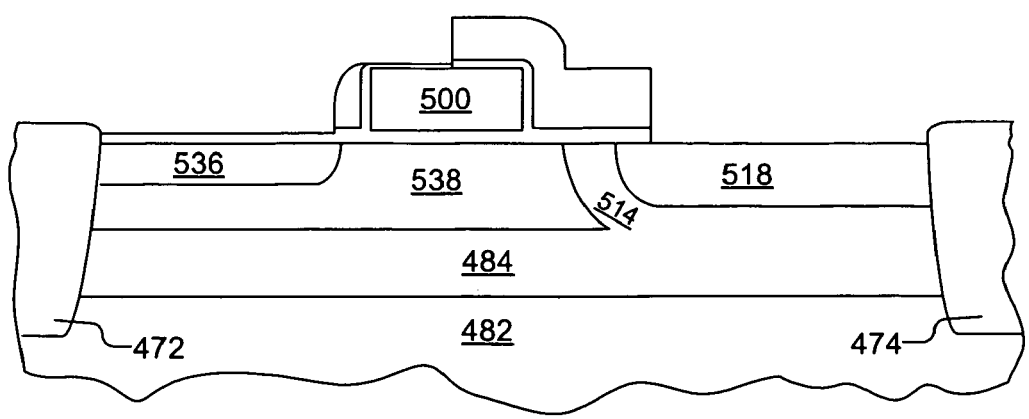

After spacers 522 and 524 are formed, the cathode region is now fabricated. A photoresist 530 is deposited (see FIG. 6H). A substantially vertical implant 534 of N-type dopant (e.g., arsenic) is used to create an N-type cathode region. An angle implant 532 of P-type dopant (e.g., boron) may also be applied for additional doping in the P-base region of the thyristor. Photoresist 530 is then stripped. FIG. 6I shows the resulting structure with the N-type cathode region 536 and a P-base region 538. In one embodiment, cathode region 536 is approximately 80 nm deep and 0.25 µm wide while P-base region 538 is approximately 100 nm deep and 0.5 µm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 7A:
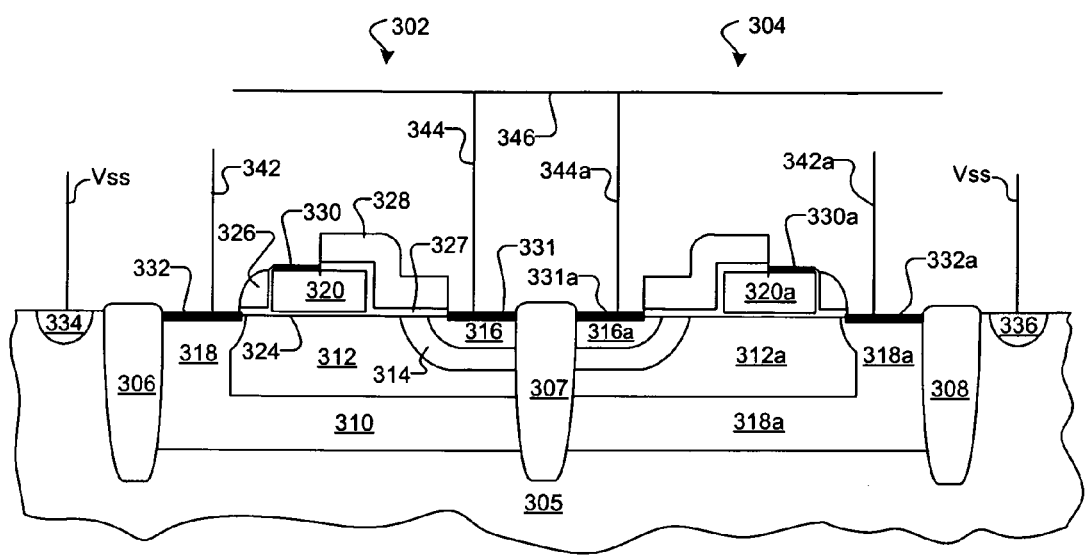
FIG. 7A is a diagram showing the cross section of two adjacent memory cells of another embodiment of the present invention.
Figure 7B:
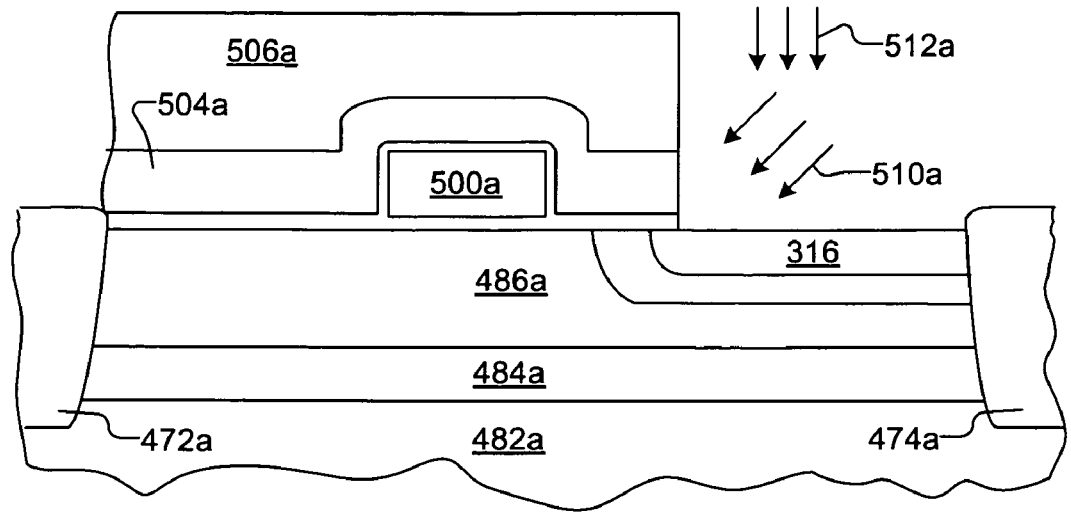
FIGS. 7B-7F show the cross section of various steps in the fabrication of the embodiment of FIG. 7A.
Figure 7C:
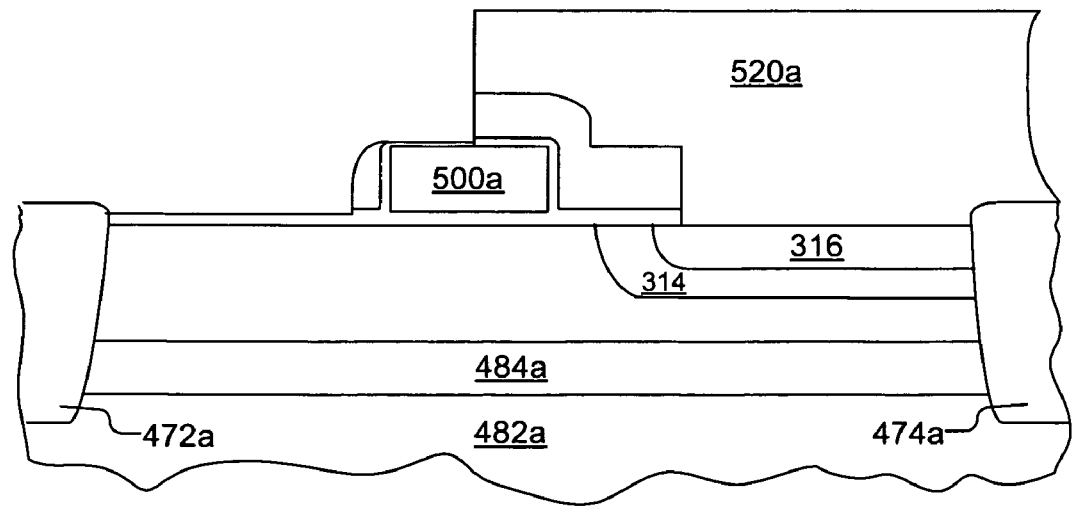

Two exemplary capacitively coupled thyristor memory cells 302 and 304 of another embodiment are shown in FIG. 7A. They are separated from each other and other memory cells by oxide isolation or shallow trench isolation ("STI") regions 306-308. The structure of these cells are substantially identical, thus only one of the cells (e.g., cell 302) is described in detail. Cell 302 comprises a thyristor body having an N region 310, P-base region 312, N-base region 314 and P+ region 316. An N+ region 318 is formed between P-base 312 and oxide/STI region 306. N+ region 318 provides electrical connection between N region 310 and a word line, as explained in more details below. A control port 320 is deposited on top of a gate dielectric 324, which is deposited on top of P-base 312. Spacer materials 326-328 may be formed adjacent to control port 320. Salicide regions 330-332 are formed on top of control port 320, P+ region 316, and N+ region 318, respectively, in areas not covered by spacer materials 326-328.

In one embodiment, it is desirable to increase the coupling between control port 320 and P-base region 312. One way to increase the coupling is to use a longer control port 320. The coupling can also be increased by using a more negative standby wordline2 voltage.

Memory cells 302 and 304 can be used in a memory array. For illustration purposes, some of the components of memory cell 304 are assigned reference numerals that are the same as the corresponding components of memory cell 302 with the letter "a" attached at the end. N+ region 318 of cell 302 can be connected to a word line 342 through salicide region 332. Similarly, N+ region 318a of cell 304 can be connected to a word line 342a through salicide region 332a. Salicide region 331 and 331a can be connected to the same bit line 346. Salicide region 330 can be connected to a wordline2 line (not shown). Similarly, salicide region 330a can be connected to another wordline2 line (not shown).

One way to fabricate the memory cells 302 and 304 is described based on FIGS. 6A-6D and 7B-7F. For simplicity, the details of fabricating one cell are shown. Formation of the trench isolation is similar to FIG. 6A and as described above. Formation of a layer of screen oxide and the deep P-type implant, N-type implant, and a shallow P-type implant are used to form a deep P-well 482 near the bottom of the trenches, an N-well 484 in the middle, and a top P-well 486 are similar to that shown in FIG. 6B, excepting the exemplary doses, energies and resulting layer thicknesses. For the deep P-well, a boron implant having a peak near the bottom of the trenches and resulting in a concentration of about $3 \times 10^{17}$ cm$^{-3}$ can be used. For the N-implant, an arsenic implant having a peak approximately 150 nm above the bottom of the trenches and a peak concentration of about $3 \times 10^{18}$ cm$^{-3}$ can be used. For the top P-implant, a boron implant having a peak less than 100 nm below the screen oxide and a peak concentration of about $10^{18}$ cm$^{-3}$ can be used. In one embodiment, top P-well 486 and N-well 484 are approximately 150 nm thick. Screen oxide layer 480 can then be removed.

The formation of a gate stack, control gate and the photoresist defining the anode region are similar to the formation shown in FIGS. 6C and 6D and described above.

In FIGS. 7B-7F, components that are similar to the corresponding components in FIGS. 6E-6I have the same reference numerals with the letter "a" appended at the end. The spacer material is etched and an angle implant 510a of N-type dopant is used to create the N-base region 314 (see FIG. 7B) which does not connect to the existing N-well. A substantially vertical implant 512a of P-type dopant is used to create a P-type anode region 316. An angle implant (not shown) of P-type dopant (e.g., boron) may also be applied for additional doping in the P-base region of the thyristor. In one embodiment, anode region 316 is approximately 80 nm deep and 0.5 μm wide while N-base region 314 is approximately 100 nm wide at the top surface of silicon. A description of anode formation is provided in U.S. Pat. No. 6,767,770 title Method of Forming Self-Aligned Thin Capacitively-Coupled Thyristor Structure. An optional carbon implant can also be performed. Carbon implant is described in U.S. Pat. No. 7,075,122 titled Thyristor Device with Carbon Lifetime Adjustment Implant and Its Method of Fabrication.

Figure 7D:
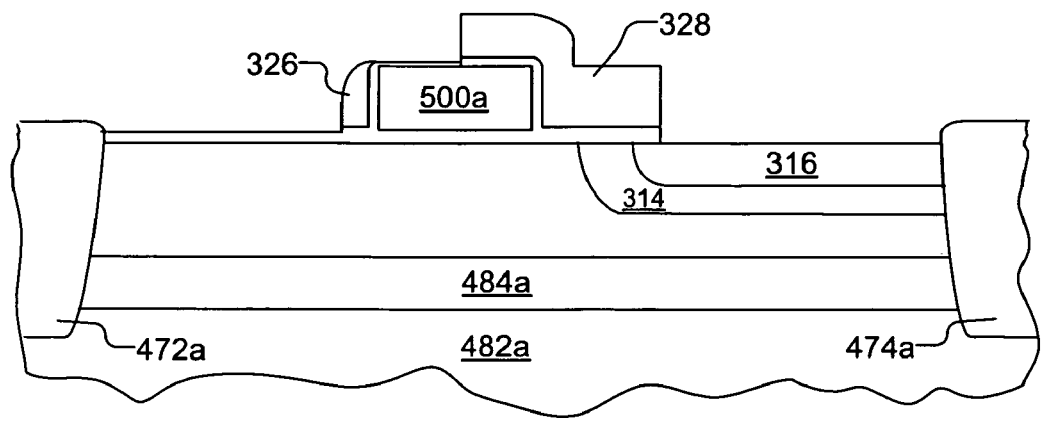
Figure 7E:
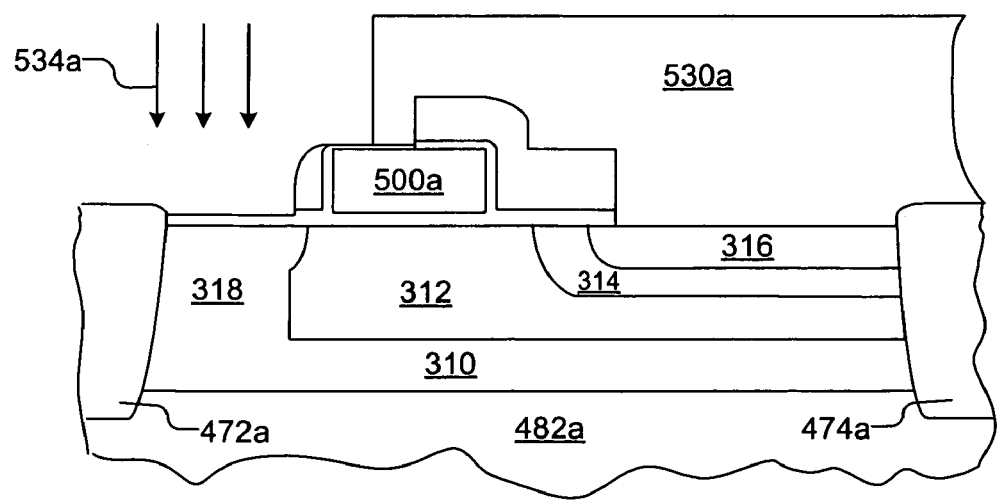

Photoresist 506a is stripped. A new photoresist 520a is deposited to define another opening (see FIG. 7C). This opening covers the cathode region of the thyristor and also regions that are not part of the thyristor. The spacer material that is not protected by photoresist 520a is etched. Etching of spacer material is described in above-mentioned U.S. Pat. No. 6,767,770. FIG. 7D shows the structure after photoresist 520a is stripped. Control gate 320 is surrounded by spacers 326 and 328.

Figure 7F:
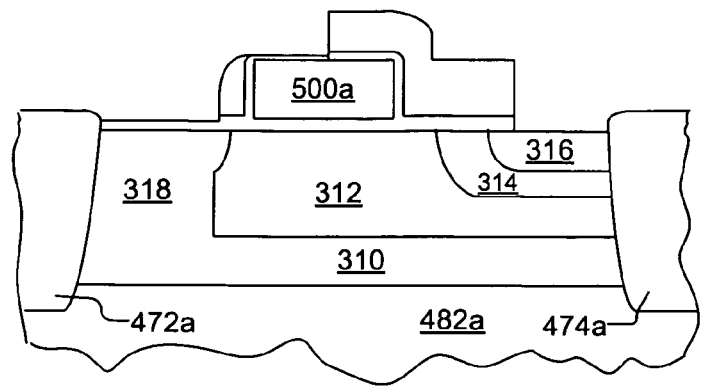

After spacers 326 and 328 are formed, the cathode region is now fabricated. A photoresist 530a is deposited (see FIG. 7E). A substantially vertical implant 534a of N-type dopant (e.g., arsenic) is used to create an N-type cathode region and connect to the N-well. Photoresist 530 is then stripped. FIG. 7F shows the resulting structure with the N-type cathode region 318. In one embodiment, cathode region 318 is approximately 0.25 μm wide while P-base region 312 is approximately 0.5 μm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 8:
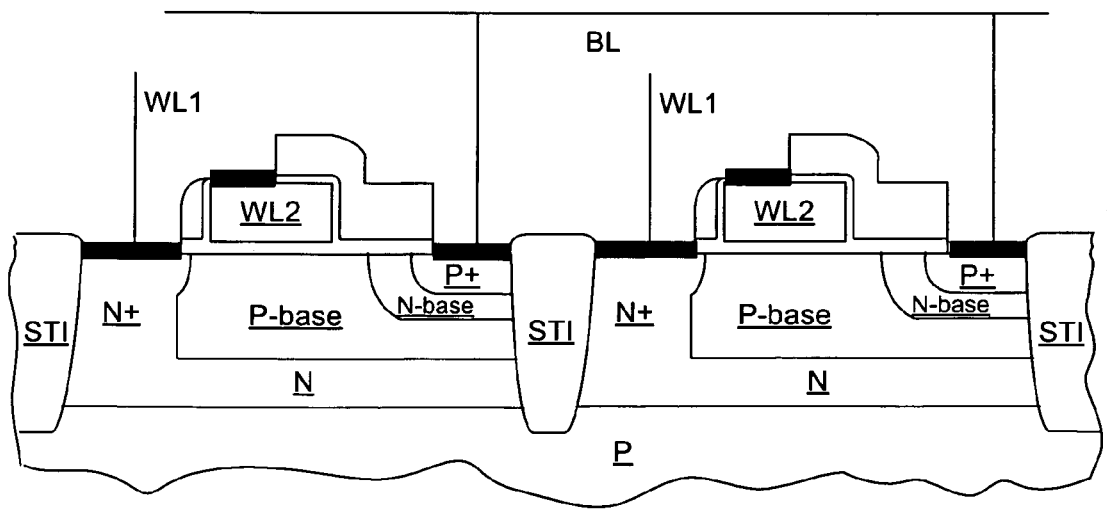
FIG. 8 is a variation of the embodiment of FIG. 7A.

The embodiment shown in FIG. 8 is similar to that in FIG. 7A with the orientation of cell 304 reversed. In FIG. 8, abbreviated names of various regions and signal lines are used instead of reference numerals for easy comprehension.

In a different electrical arrangement, the connection of BL and WL1 to the cathode and anode of the thyristors in FIGS. 7A and 8 can be reversed.

Figure 9A:
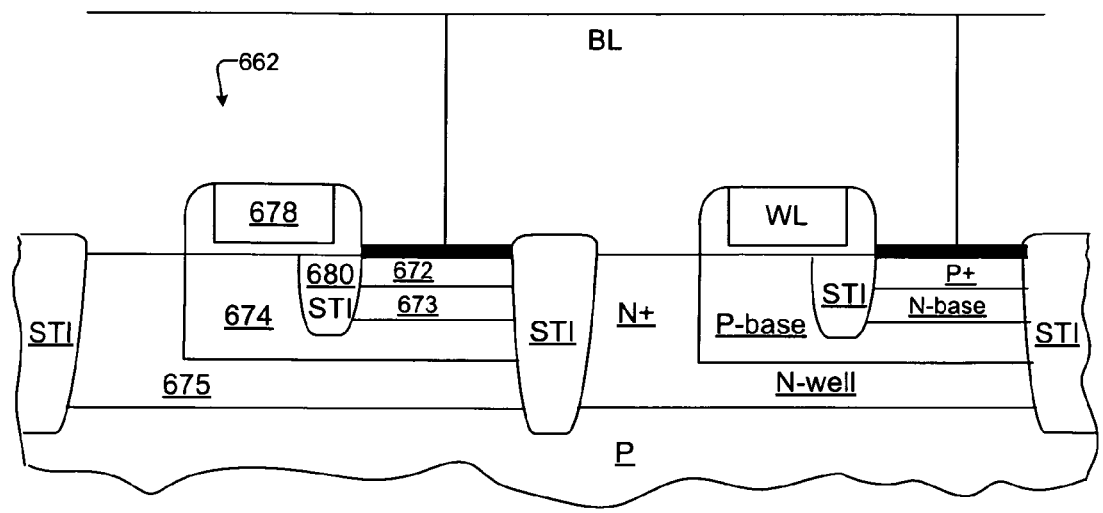
FIG. 9A is a diagram showing the cross section of two adjacent memory cells of a further embodiment of the present invention.
Figure 9B:
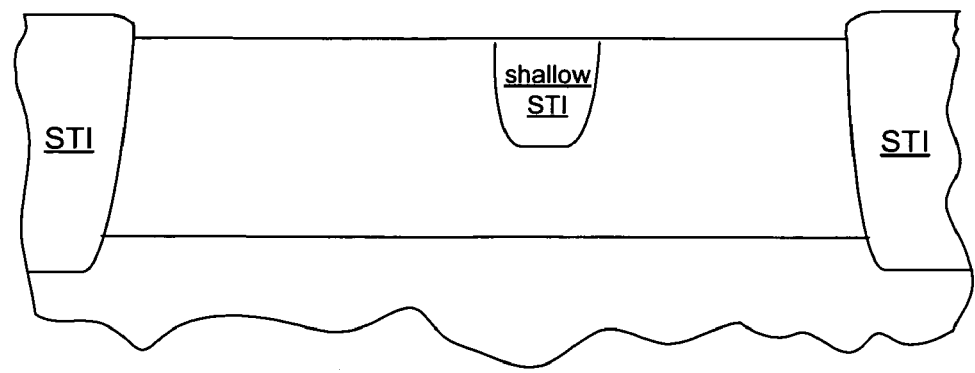
FIGS. 9B-9D show the cross section of various steps in the fabrication of the embodiment of FIG. 9A.
Figure 9C:
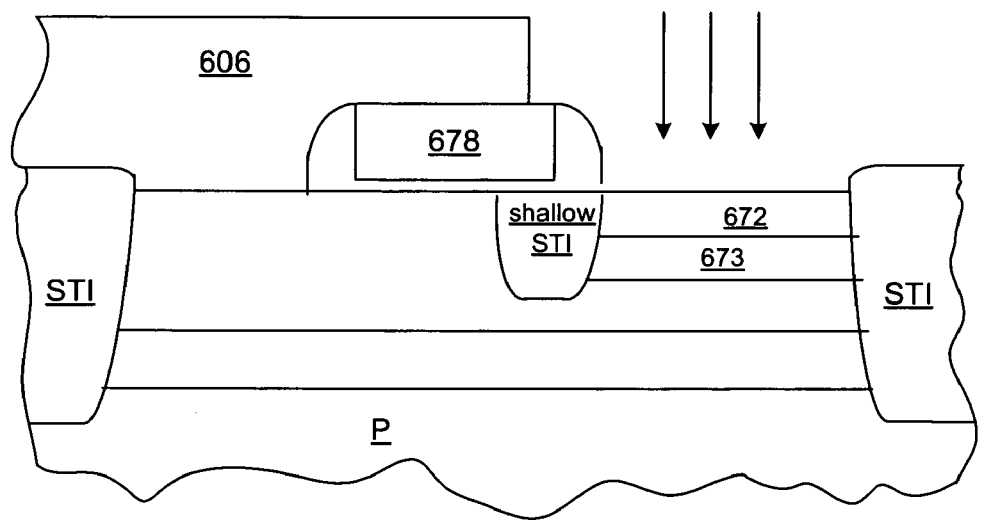
Figure 9D:
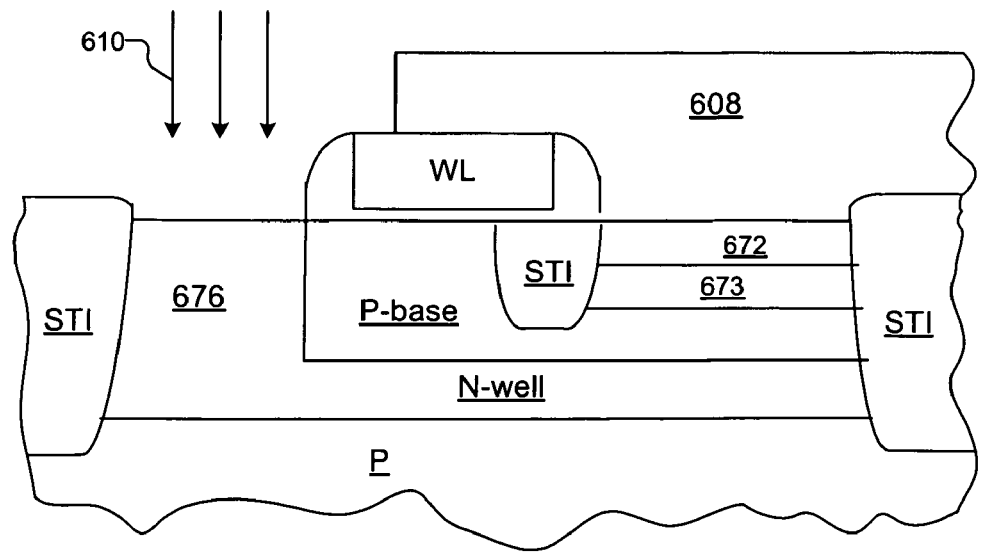

An additional STI can also be used to remove N-base and wordline overlap. FIG. 9A shows a memory cell 662 that comprises a control gate 678 and a thyristor body (a P+ region 672, an N-base region 673, a P-base region 674, and an N+ region 675). An additional STI 680 is positioned between gate 678 and the thyristor body of P+ region 672 and N-base region 673. Another advantage of this embodiment is that it leads to improved junction leakage.

One way to fabricate the memory cell 662 is described based on FIGS. 6A-6D and 9B-9D. For simplicity, the details of fabricating one cell are shown. Formation of the first deep trench isolation is similar to FIG. 6A and as described above. A second (shallower) STI, corresponding to STI 680 in FIG. 9A, is then formed within the active region defined by the first, deeper STI (see FIG. 9B). Formation of a layer of screen oxide and the deep P-type implant, N-type implant, and a shallow P-type implant of FIG. 6B are used to form a deep P-well near the bottom of the trenches, an N-well (later fabricated to become N-well 675 of FIG. 9A) in the middle, and a top P-well (later fabricated to become P-base 674 of FIG. 9A), excepting the exemplary doses, energies and resulting layer thicknesses. For the deep P-well, a boron implant having a peak near the bottom of the first deep trenches and resulting in a concentration of about $3 \times 10^{17}$ cm$^{-3}$ can be used. For the N-implant, an arsenic implant having a peak approximately 150 nm above the bottom of the first deep trenches and a peak concentration of about $3 \times 10^{18}$ cm$^{-3}$ can be used. For the top P-implant, a boron implant having a dosage a peak less than 100 nm below the screen oxide and a peak concentration of about $10^{18}$ cm$^{-3}$ can be used. In one embodiment, top P-well 486 and N-well 484 are approximately 150 nm thick. Screen oxide layer 480 can then be removed.

A gate stack and a control gate 678 are formed (similar to the formation shown in FIGS. 6C and 6D above). Note that one edge of the gate is located over the shallow STI region (see FIG. 9C).

The unmasked spacer material is etched and a photomask 606 is applied. An implant of N-type dopant is used to create an N-base region 673 (see FIG. 9C) which does not connect to the existing N-well and whose junction with the P-well is above the bottom of the shallow STI. A substantially vertical implant of P-type dopant is used to create a P-type anode region 672. In one embodiment, anode region 672 is approximately 80 nm deep and 0.5 μm wide while N-base region 673 is approximately 100 nm wide. A description of anode formation is provided in U.S. Pat. No. 6,767,770 title Method of Forming Self-Aligned Thin Capacitively-Coupled Thyristor Structure. An optional carbon implant can also be performed. Carbon implant is described in U.S. Pat. No. 7,075,122 titled Thyristor Device with Carbon Lifetime Adjustment Implant and Its Method of Fabrication.

The cathode region is now fabricated. A photoresist 608 is deposited (see FIG. 9D) and exposed. A substantially vertical implant 610 of N-type dopant (e.g., arsenic) is used to create an N-type cathode region 676 and connect to the N-well. Photoresist 608 is then stripped. In one embodiment, cathode region 676 is approximately 0.25 μm wide while P-base region 674 is approximately 0.5 μm at the top surface of silicon.

Regular CMOS processing, such as rapid thermal anneal and silicide formation, can be used to complete the fabrication. Heavy ion leakage implant can also be applied to the anode region. Details of such implant are described in the above mentioned U.S. Pat. No. 7,075,122.

Figure 10:
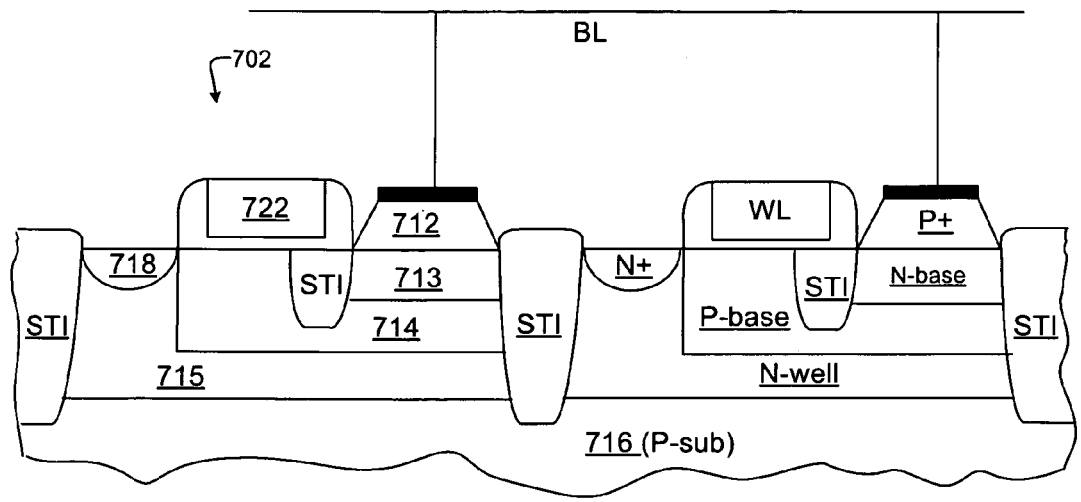
FIG. 10 shows an embodiment of two adjacent memory cells with raised P+ region.

FIG. 10 shows an embodiment of a memory cell 702 with raised P+ region 712. The thyristor body also comprises an N-base region 713, a P-base region 714 and an N-well 715. The cell is fabricated on a P-sub 716. An N+ region 718 is formed near the surface of N-well 715. Memory cell also has a control gate 722. Methods to fabricate raised P+ region 712 can be found in U.S. Pat. No. 6,888,176 titled "Thyristor Semiconductor Device," which is incorporated herein by reference.

The memory cells of FIGS. 5A, 7A, 8, 9A and 10 can have alternative structures. Some of the alternatives are (1) all the N and P type regions can be reversed, (2) only the control gate is salicided (polyside process), (3) salicide completely blocked from all regions, (4) raised source/drain processing can be performed on the anode and/or cathode side (a description of performing such processing on the anode and cathode of a thyristor can be found in U.S. Pat. No. 6,888,176), (5) Hi-K material can be used as gate dielectric, and (6) metal gate can be used as the control gate.

Figure 11:
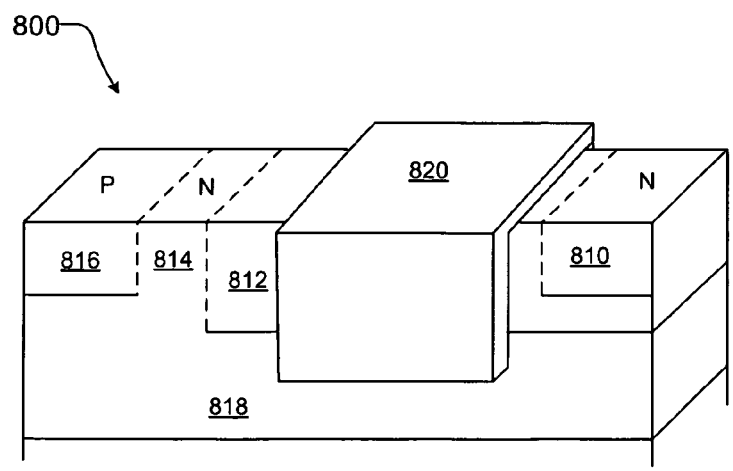
FIG. 11 shows an additional embodiment of a memory cell of the present invention.

As an additional alternative structure, the control gate can be capacitively coupled to the P-base on the vertical sidewalls that are perpendicular to the control gate instead of or in additional to capacitively coupling from the top. An example of such a memory cell 800 is shown in FIG. 11. Memory cell 800 is positioned between two STI regions (not shown). It comprises a control gate 820 and a body (P region 816, N-base region 814, P-base region 812, and N region 810) sitting on top of an N-well 818. This structure can be fabricated using the technique described above and a publication titled "Fabrication of Body-Tied FinFETs (Omega MOSFETs) Using Bulk Si Wafers" by T. Park, et al., published in the 2003 Symposium on VLSI Technology Digest of Technical Papers.

Figure 15:
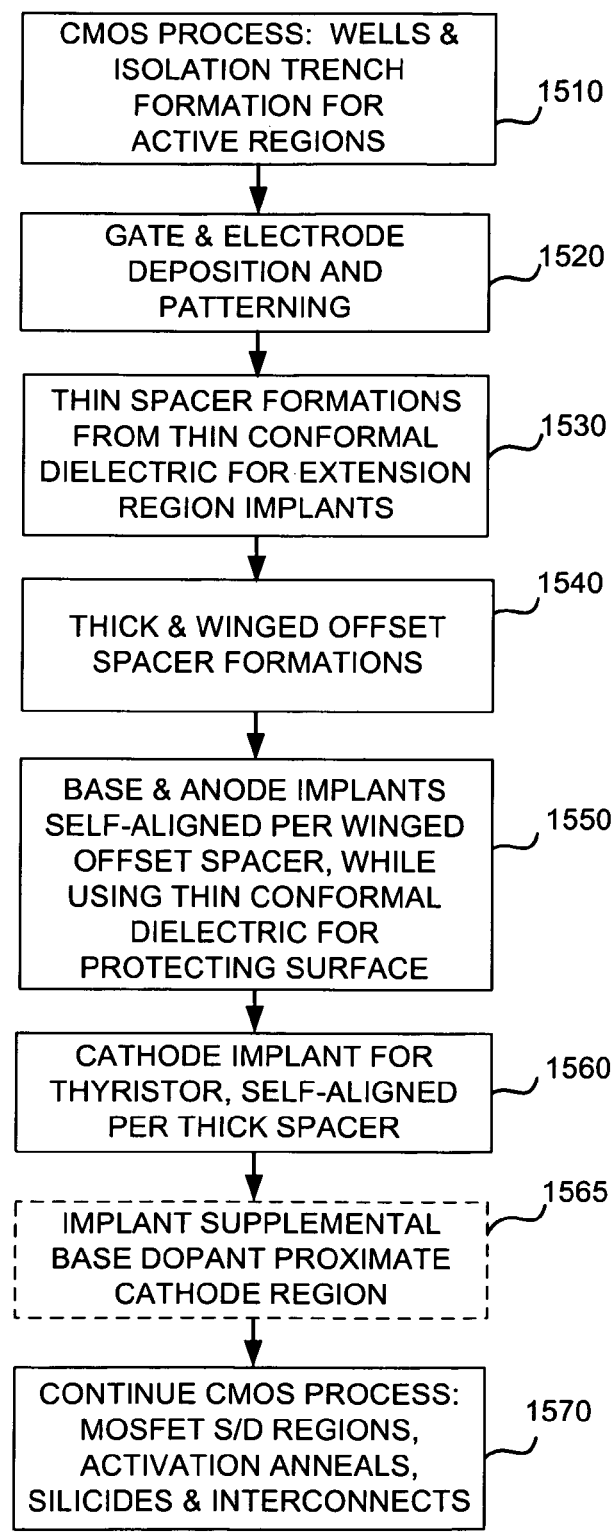
FIG. 15 is a simplified flow chart useful for describing a method of fabricating a thyristor based semiconductor memory device in accordance with an embodiment of the invention.

In accordance with a further embodiment of the present invention, referencing the cross-sectional views of FIGS. 12A-12L together with the flow chart of FIG. 15, a process of fabricating (1500 of FIG. 15) a semiconductor device includes defining (1510 of FIG. 15) active regions in a semiconductor substrate. Isolation or shallow trench isolation (STI) regions 472, 474 may be formed to outline (at least in part) thyristor active regions. Further STI regions 477, 478, 479 may also be formed to outline (at least in part) MOSFET active regions. Accordingly, the active regions for a thyristor may be bound at least in part by isolation trenches 472 and 474, while the active region for an N-channel MOSFET may be bound by trenches 477 and 478, and that for a P-channel MOSFET between trenches 478 and 479.

As described previously herein for an embodiment with reference to FIGS. 6A and 6B, the trenches for the STI structures may be formed (1510 of FIG. 15), for example, with a depth of about 0.3 micrometers and width of about 80 nanometers. The starting substrate material may comprise silicon of P-type dopant of concentration of about $10^{15}$ cm$^{-3}$. The trenches are filled with insulating dielectric such as oxide.

Figure 12A:
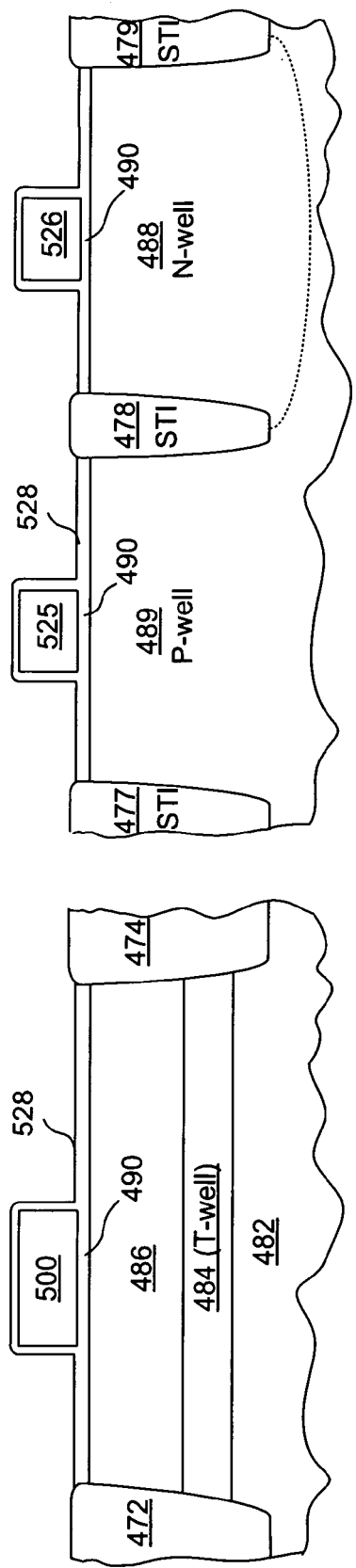

A layer of screen oxide may be grown over the surface of the semiconductor material and over the active regions. Implants for deep P-well 482, middle N-well 484 and top P-well 486 may be directed through the screen oxide and into the active region of semiconductor material for the thyristor—i.e., disposed between isolation trenches 472, 475 (FIG. 12A). During such well implants, the active regions for the MOSFETs may be protected by a predefined mask.

In one example, the deep P-well for the thyristor active region may be formed using a boron implant with dosage of about $1\times10^{14}$ cm$^{-2}$ and energy of about 200 KeV. The middle N-well may be formed with an implant of N-type dopant of arsenic of about $5\times10^{13}$ cm$^{-2}$ dosage and energy of about 300 KeV. The top P-well region may be formed with an implant of boron with dosage of about $1\times10^{13}$ cm$^{-2}$ and energy of about 15 KeV.

Further referencing FIG. 12A, top P-well 486 and middle N-well 484 may be formed with thickness of about 100 nm. The deep P-well 428 may be formed with a peak (e.g., boron) concentration of about $1\times10^{18}$ cm$^{-3}$ at a depth that is about the same as the depth for the laterally adjacent trenches (e.g., 0.3 µm). The middle N-well may be formed with a peak concentration of about $1\times10^{18}$ cm$^{-3}$. The top P-well may form a peak concentration of about $1\times10^{18}$ cm$^{-3}$. In one embodiment, the top P-well 486 and middle N-well 484 have a thickness of about 100 nm.

Regarding the MOSFET active regions, further referencing FIG. 12A, N-well 488 and P-well 489 may be formed in active areas for P-channel and N-channel MOSFETs respectively. N-well 488 may be formed between isolation trenches 478 and 479, for example, using an implant of arsenic with dosage of about $10^{13}$ cm$^{-2}$ and implant energy of about 400 KeV. Likewise, in the active region for the N-channel device between isolation trenches 477 and 478, P-well region 489 may be formed using an implant of boron of about $1\times10^{13}$ cm$^{-2}$ and energy of about 60 KeV.

When referencing some embodiments disclosed herein, buried N-well 484 may be referenced alternatively as a buried T-well.

Further referencing FIG. 12A, following the implants for (i) deep P-well 482, (ii) buried n-well 484 and (iii) top P-well 486 in thyristor regions, and the implants for (iv) the N-well and P-well regions for the MOSFETs, the screen oxide may be removed. Gate structures 525, 526 may then be formed (1520 of FIG. 15) over body regions for the MOSFETS, and electrode 500 may be formed over a base region for the thyristor. These electrode and gate structures may be realized similarly as presented earlier relative to FIGS. 6C-6D.

For example, the screen oxide layer may be removed and gate dielectric 490 formed conformally over the semiconductor material. In a particular example, the oxide may be conformally layered with depth of about 3 nm. Conductive material such as polysilicon may be deposited and patterned to form electrode 500 and gates 525, 526 over respective regions for the thyristor and MOSFETs. In a particular example, the conductive material (such as polysilicon) may be formed with a thickness of about 150 nm.

In some embodiments, the polysilicon for the electrode (to the thyristor) may be implanted with P-type dopant.

In a particular example, electrode 500 may be formed with a width of approximately 0.2 micrometer (µm). Upon forming electrode 500 and gates 525, 526, a thin layer of oxide 528 may be formed (FIG. 15 and block 1530) conformally over the electrodes 500 and thyristor active regions, and over the gates 525, 526 and MOSFET active regions. In a particular example, oxide 528 may be formed by thermal oxidation with a thickness of a few nanometers.

Figure 12B:
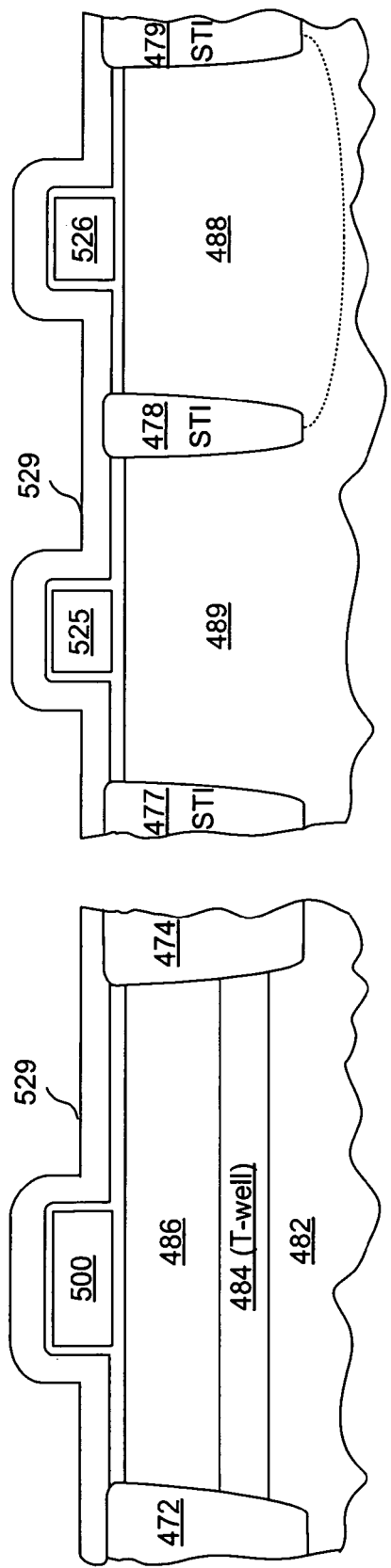

Moving forward with reference to FIG. 12B, nitride 529 may be conformally deposited over oxide 528. In a particular example, the nitride may be formed with a thickness of about 10-50 nanometers. The combined oxy/nitride thickness of oxide 528 and nitride 529 may be determined according to a given MOSFET procedure. For example, the thickness of the conformal oxide and nitride may be predetermined in accordance with target widths desired for the formation of extension spacers against the sidewalls of the gates, which in turn are to be used for aligning implants during the formation of extension regions (MDD) for the MOSFET devices.

Moving forward with reference to the cross-section of FIG. 12C, photoresist 541 may be formed over nitride layer 528 and patterned for defining windows to MOSFET active regions. The patterned photoresist 541 may be used to cover and protect regions of semiconductor material for the thyristors. Using the window defined by the photoresist, exposed portions of the dielectric 529,528 may be etched by an anisotropic etch to form extension spacers 540 against side-walls of gates 525, 526. In a particular example, side-wall spacers 540 may be formed with a lateral width of about 20-50 nanometers, based on the thickness of the former conformally formed oxide and nitride.

Extension regions 581, 582 may be formed in the semiconductor material for the MOSFETs using, in some embodiments, an angled implant for respective extension dopants (and/or halo implants). Such implants could slightly undercut the oxide/nitride extension spacers 540. In other words, the extension regions 581,582 may be formed in self-aligned relationship with respect to gates 525 and 526 as defined per the lateral offsets of their respective extension spacers 540.

Moving forward with further reference to the cross-sectional views of FIGS. 12E-12F, photoresist 541 is removed and thicker spacer material of oxide 542 and nitride 544 may be formed (1540 of FIG. 15) conformally over the previous conformally formed dielectric 528, 529, and over the electrodes and gates to the respective thyristor and MOSFET regions. In a particular example, oxide 542 may be conformally deposited with depth of about 5-10 nm (e.g., 7 nm cap oxide); and nitride 544 may be conformally deposited with a depth of about 10 to 30 nanometers (e.g., 15-20 nm).

In one particular example, the oxide 542 may be formed at least in part via a rapid thermal anneal for partial activation of the dopants implanted for the extension regions (e.g., for moderately doped drain and/or halo or pocket implants to the body regions) to respective N-channel and P-channel MOSFETs.

Following the deposition of the conformal nitride layer 544, moving forward with reference to FIG. 12G, another oxide 546 may be conformally deposited with thickness of about 30 to 100 nm. Accordingly, the further spacer dielectric material may be formed collectively via the oxy/nitride/oxy stack 542,544,546. The collective thickness for this further dielectric may be formed dependent on predetermined thickness for offset S/D sidewall spacers to gates for the MOSFETs, and as may be necessary for their respective source and drain implants.

Referencing FIG. 12H, photoresist 548 may be deposited and patterned to define an opening that may be used to assist in the formation of an anode region for the thyristor. The patterned photoresist while protecting active regions that are to be associate with MOSFETs, defines an opening for exposing select regions of the further dielectric over anode regions for the thyristor. The select regions of the further spacer material 546, 544, 542 may be etched as exposed and defined by the window of the patterned photoresist 548. In a particular embodiment, the etching of the exposed regions of the further dielectric is stopped on, and upon reaching and exposing the former conformally formed dielectric material 528, 529.

Using the patterned photoresist 548 and the thus etched further dielectric as a hard mask (further referencing FIG. 12H), an angled implant 510 of N-type dopant may be performed (1550 of FIG. 15) to form an N-base region 514. Additionally, a substantially vertical implant 512 of P-type dopant may be performed to form an anode region 518 in the semiconductor material and in self-aligned relationship to the mask defined by the window of patterned photoresist 548 and patterned dielectric 542, 544, 546.

In a particular example, anode region 518 may be formed with a depth of about 100 nm and width of about 0.1 μm. The N-base 514 may be formed with a width of about 100 nm at the surface of the semiconductor material. Further, an implant energy associated with forming N-base 514 may be great enough to form an extent of N-base region 514 sufficient to join buried N-well (to define in part the buried T-well) 484.

Accordingly, N-base 514 is formed to be electrically in common with buried N-well 484, and may be referenced collectively with a "T" shaped cross-section defined in part by the buried T-well. For such collective N-base region 514, 484, the stem of the N-base 514 separates anode region 518 from P-base region 538. P-base 538, on the other hand, comprises a lateral extent that extends outwardly from the side of the stem opposite anode region 518, and is disposed between buried N-well 484 and the surface of the semiconductor material beneath electrode 500.

Moving forward with reference FIG. 12I, photoresist 548 is removed and new photoresist 550 formed and patterned over the semiconductor material to define another etch window, by which to further assist in formation of thick spacers from the further conformally deposited dielectric. The patterned photoresist 550 defines a window for exposing select regions of the further dielectric, including regions over the cathode regions for the thyristor. An anisotropic etch may be performed through the window to form thick sidewall spacers 543 against a sidewall of electrode 500 proximate the cathode region, wherein the cathode side of the electrode is laterally opposite the anode region. Accordingly, sidewall spacer 553 is formed from the further layered dielectric with width dependent upon the thickness of such conformally layered dielectric—e.g., a width of about 20 to 70 nanometers. The anisotropic etch of the thicker dielectric via the window of patterned photoresist 550 may be further understood to form thick spacers 552 against the sidewalls of respective gates 525,526. These thicker S/D sidewall spacers may be understood to assist self-aligned implants for the source and drain regions of the MOSFETS.

In further embodiments, the dielectric patterning defined may also be used to assist subsequent formation of silicide in select regions of silicon exposed by the patterned dielectric. Such silicide region could include regions over source and drain regions for the MOSFETs, over exposed silicon to the cathode region for the thyristor and likewise over exposed regions of polysilicon at the surface of gates 525, 526 for the MOSFETs and the shoulder of electrode 500 for the thyristor.

Returning with further reference to FIG. 12I, an anisotropic etch of the oxide/nitride/oxide stack of further dielectric 542,544,546 in accordance with a particular embodiment, may be sustained for duration sufficient to etch through such stack over the cathode region of the thyristor. In one particular embodiment, the etch is continued sufficiently long to also etch through the thickness of the former conformally layered dielectric 528,529 as was used previously in the definition of the extensions spacers. Accordingly, for such embodiment, the surface of a portion of the semiconductor material for the cathode region for the thyristor is exposed.

In an alternative embodiment, the anisotropic etch may be discontinued upon reaching the previous formed conformal dielectric 528,529. For example, the anisotropic etch may be sustained until etching a thickness of the further oxy/nitride/oxy dielectrics 542, 544 486. This etch may be stopped upon reaching the previously formed conformal dielectric 528,529. The thin conformal dielectric 528,529 accordingly may be left over the surface of semiconductor material, wherein any cathode implants (1560 FIG. 15) would employ implant energy sufficient to pass the dopants through the thin layer of dielectric. By such embodiment, it may be recognized that the previously formed conformal dielectric 528, 529 may serve to protect (per phantom lines of the simplified cross-section of FIG. 12I) an integrity of surface regions of the semiconductor material for the thyristor regions—e.g., over the cathode region, over the N-base region 514 and over the junctions defined between the N-base region relative to its neighboring P-base and anode regions.

It may be understood, therefore, that during subsequent integration, contacts would be formed through this dielectric for enabling interconnect contacts to the respective cathode and/or anode regions.

Continuing relative to such alternative embodiment, the anisotropic etch over the MOSFET regions etches through the further conformal spacer materials 542,544,546 and exposes mask and drain regions of semiconductor material for source and drain regions of the MOSFETs regions. Note, the previous formed conformal dielectric 528,529 as was used to form the extension spacers 540 (FIG. 12C) remains layered only upon the thyristor region (aside from the already formed extension spacers). Accordingly, the subsequent etch through the thickness of the further dielectric over the MOSFET active regions may expose the surface of the semiconductor material over the source and drain regions. It may be recognized that the surface regions of the MOSFET gates 525,526 will also be exposed. For the thyristor regions, at least of this particular alternative embodiment, the integrity to surface regions of the semiconductor material for the thyristor, are preserved as protected by the previously formed conformal dielectric 528,529.

In further embodiments, the patterned dielectric may in turn be used subsequently to define regions of silicon for silicide processing. Silicide may be formed on select regions of the silicon and poly that are left exposed by the patterned dielectric. For the alternative embodiment, the silicide is formed only on the exposed silicon surface regions of the source, drain and gate for the MOSFETs; the surface regions of the thyristor, in such embodiment, remain covered by dielectric and avoid silicide treatment.

Returning to the former embodiment, with further reference to FIG. 12J, photoresist 550 may be removed. Sidewall spacer 553 is disposed against the cathode sidewall of electrode 500 (cathode spacer 553). Similar width spacers 552 are disposed against the sidewalls of gates 525,526 (source/drain spacers 552). On a side of the electrode proximate the anode region (opposite the cathode), the patterned dielectric may be referenced as winged lateral offset spacer 555. This winged lateral offset spacer 555 overlaps a shoulder of the electrode and extends laterally outward from the electrode to overlap a width of N-base region 514 and a portion of anode region 518.

Moving forward with reference to FIG. 12K, photoresist 565 may be deposited and patterned over the semiconductor material to protect regions for the MOSFETs and also to protect the anode region to the thyristor. The patterned photoresist defines an opening for exposing cathode regions for the thyristors. The window for the associate implant mask may be understood for this embodiment as being defined collectively by photoresist 565 and a portion of electrode 500 and cathode spacer 553. A substantially vertical implant 534 of N-type dopant, such as arsenic, may be used to create (1560 FIG. 15) N-type cathode 536. An angled implant 532 of P-type dopant such as boron may implant supplemental P-type dopant into a particular region (539 FIG. 12L) of the P-base region 538 for the thyristor. The particular region 539 of the P-base region to receive the supplemental P-type dopant may be described as a thinned portion of the P-base as defined between cathode region 536 and the buried N-well 484. The supplemental P-type dopant may be implanted 532 (FIG. 12K) with an energy sufficient to penetrate the semiconductor material for placement between the cathode region 536 and buried N-well 484. In a particular example, the cathode region 536 may be formed with a depth of approximately 100 nm and a width of about 0.1 μm. The P-base region 538 beneath electrode 500 may be formed with a depth of about 100 nm and width of about 0.5 μm. During these processes, it may be noted that the formerly formed conformal dielectric 528,529, from which the extension spacers were formed, have been kept over the surface of the silicon material proximate the N-base region 514 and its associated junctions to neighboring P-base region 538 and anode region 518.

While not shown specifically in the sequence of cross-sectional views referenced for this embodiment, it may be understood, however, that source and drain implants may be performed for the MOSFET devices about gates 525, 526 and their respective S/D sidewall spacers 552. The source and drain dopants may be implanted into the source/drain region of the semiconductor material while patterned photoresist may mask and protect thyristor regions. For example, one mask may be used to define openings for implanting source/drain regions for the N-channel MOSFETs, and another mask may be used to define windows for implanting the source/drain regions for the P-channel MOSFETs. The photoresist patterning and respective source/drain implants may be integrated (within the overall fabrication for one embodiment) either before or for other embodiments following the definition of the cathode region for the thyristor.

Following the formation of the thyristor memory cell 562 and MOSFET devices 560, further CMOS processing (1570 FIG. 15) may follow. For example, the implanted dopant may be activated within the semiconductor material by activation or rapid thermal anneals, and silicide processes may be performed to form silicide over exposed regions of silicon and polysilicon as permitted via the patterned dielectric. The further processing may also form the contacts and integration interconnects for interconnecting the various devices.

In accordance with a further embodiment of the present invention, referencing the cross-sectional views of FIGS. 13A-13L, a method of fabrication includes forming a thyristor memory cell integrated collectively with MOSFET devices. The method may also include siliciding at least a portion of silicon over the anode region.

Referencing FIGS. 13A-13B, a buried N-well 484 may be formed between a top P-well 486 and an underlying deep P-well 482. Similarly, P-well regions 488 may be formed in semiconductor material of the periphery outside an area for thyristor memory cells. These P-wells 489 may be formed in select regions for assisting definition of N-channel MOSFETs. N-wells 488 may similarly be formed for assisting formation of P-channel MOSFET devices. The active regions for the thyristor may be defined at least in part between Shallow Trench Isolation structures 472, 474, and those for the MOSFETs between STI's 477, 478, 479.

Electrode 550 may be formed over insulating dielectric 490 over the active area of silicon for the thyristor. Gates 525,526 may similarly be formed over body regions for the MOSFET devices over respective P-well 889 and N-well regions 488. A thin oxy/nitride conformal layer of spacer material 428,429 may be formed conformally over the electrodes and gates of the respective thyristor and MOSFET regions. The thin conformal oxide/nitride layer depositions may be formed similarly as described herein before relative to FIGS. 12A and 12B.

Moving forward with reference to FIG. 13C, photoresist 548 may be formed and patterned over the formerly formed conformal oxy/nitride dielectric layers 428, 429. The photoresist is patterned to define an opening for exposing anode regions for the thyristor while protecting MOSFET regions. An anisotropic etch may be used to directionally etch through the exposed conformal dielectric 428, 429 so as to expose portions of the semiconductor material to be associated with the anode for the thyristor. Using at least one of the patterned photoresist 548 and patterned dielectric 428,429 as a mask, an angled implant 510 of N-type dopant forms N-base region 514. The N-base may be formed in the semiconductor material at a location laterally offset from the electrode, yet beneath the winged offset spacer 555b (FIG. 13D). A substantially vertical implant 512 of P-type dopant may then be used to create anode region 518 for the thyristor. In a particular example, the anode region may be formed with approximately a 100 nanometer depth and 0.1 micrometer width, while the N-base region 514 may be formed with a width of approximately 100 nanometers near the top of the silicon and a depth sufficient to join the N-base region 484. Similarly as described before with reference to FIG. 12, the stem for the inverted "T" structure as is formed by the N-Base region 514 is disposed laterally between the anode region 518 and the P-base region 538. For this embodiment, P-base region 538 extends laterally outward from a side of the stem that is opposite to anode 518, and is further disposed between the surface of the silicon material and buried N-well 484.

Moving forward with reference to FIGS. 13D-13E, photoresist 548 is removed and new photoresist 641 is deposited for protecting thyristor regions. The photoresist 641 is patterned for defining a window to expose regions for the MOSFETs. An anisotropic etch is used to directionally etch through a thickness of the thin conformal dielectric material of oxy/nitride 428, 429 and to form sidewall spacers 540 against the sidewalls of gates 525, 526. After the formation of the extension spacers 540 about the gates 525,526, photoresist 641 may be removed (FIG. 13F). At this point, extension region implants for moderately doped drain and/or pocket implants for respective P-channel and N-channel MOSFETs may be performed (not shown) for defining the extension regions 581, 582 to respective P-channel and N-channel MOSFETs.

The extension regions 581 and 582 for respective N-channel MOSFETs and P-channel MOSFETs may be formed in the respective regions of the silicon material for the P-well 489 and N-well 488. The extension regions 581, 582 are formed in self-aligned relationship with the gate structures as defined by the respective extension offset spacers 540. Similarly as described before, the extension implants may be referenced alternatively as moderately doped source/drain implants. The implants may also include additional pocket or threshold or halo implants by which to further adjust characteristics for the respective N-channel and P-channel MOSFETs. Further, it may be understood that although not shown specifically within this particular sequence of drawings, that the implants for the N-channel and P-channel devices may be performed separately with the assistance of respective photoresist masks. In other words, one photoresist mask would be used to define openings over the P-well region 489 for assisting the implant of extension regions 581 to be associated with N-channel MOSFETs; while a separate mask would be used to define windows over the N-well regions 488 to assist implant of extension regions 582 for the P-channel MOSFETs.

Referencing FIG. 13G, a conformal layer of oxide 542, for example, 7 nm cap-oxide, may be formed over gates 525, 526 and electrode 500 over associated active regions for the MOSFETs and thyristor. In a particular embodiment, a rapid thermal anneal may assist activation of at least a portion of the implants for the extension, threshold and/or pocket adjustment regions.

Continuing further with reference to FIG. 13H, a conformal layer of nitride 544, for example, 15 to 100 nm nitride deposition may be formed conformally over oxide 542. It may be noted that during these dielectric layer depositions, the surface regions of the semiconductor material over N-base 514 and associated junctions of N-base region 514 relative to the neighboring anode region 518 and P-base region 538, that these surface regions remain protected by the previously layered conformally dielectric 528, 529, of which different regions were previously used in the formation of the extension spacers.

Figure 13I:
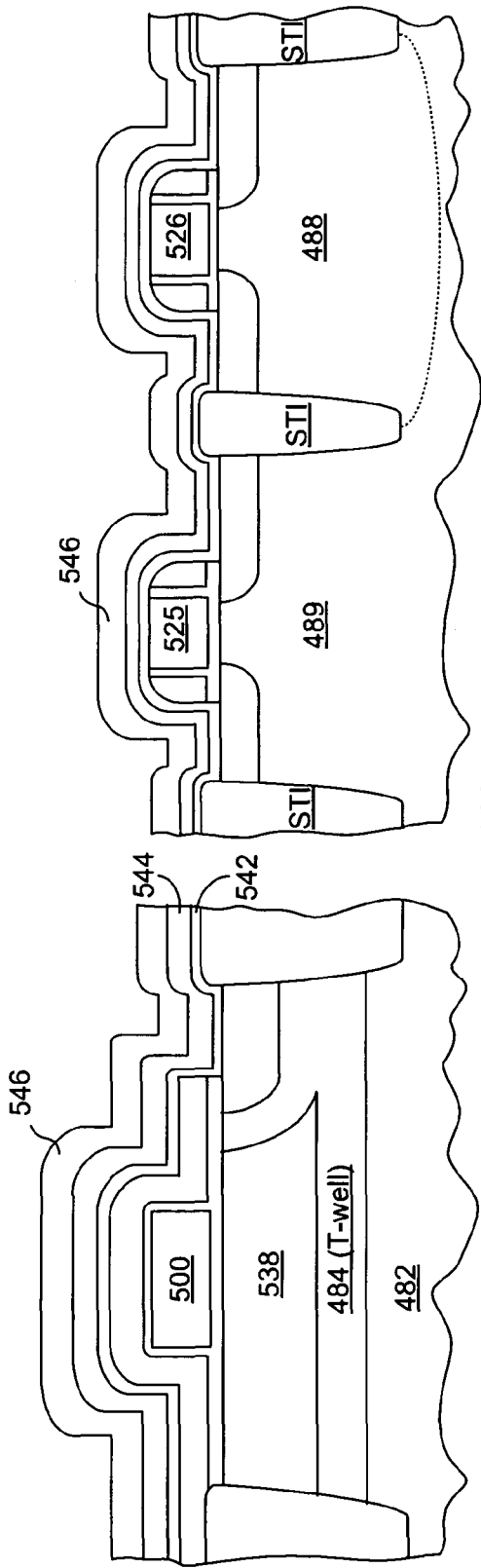
Figure 13J:
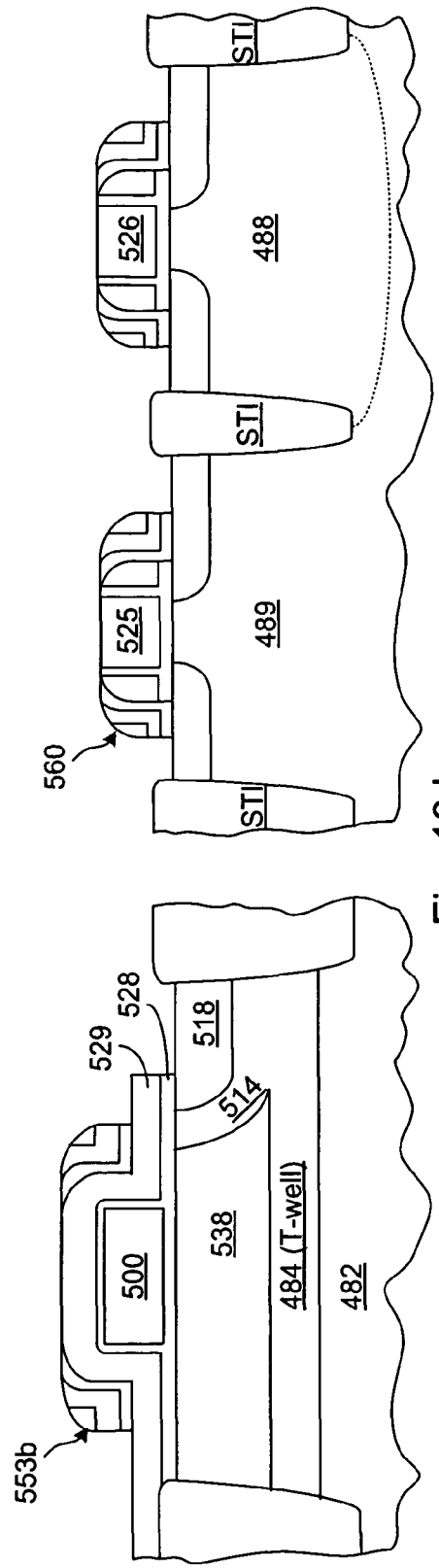

Following deposition of nitride 544, referencing FIG. 13I, an additional oxide layer 546 is conformally deposited, e.g., with thickness of about 10 to 50 nm. Thus, the further dielectric (for the thick spacers) is conformally formed over the respective electrode and gates for the thyristor and MOSFETs respectively. The thickness of the dielectric oxide/nitride/oxide stack 442, 444, 446 may be approximately in the range of 45 to 60 nm, as predetermined based on the desired offset for the source and drain regions about their respective gates 525, 526. In other words, the thickness of the oxy/nitride/oxy spacer material is predetermined based on the width targeted for the S/D offset spacers that are to be formed against the sidewalls of the gates Referencing FIG. 13J, an anisotropic etch directional etches the thicker spacer material 542, 544, 546 until stopping on the previous conformally formed thin dielectric of oxide 428 and nitride 429. In other words, the anisotropic etch includes etching through a thickness of oxide 546, a thickness of nitride 544 and a thickness of oxide 542, until exposing underlying nitride 429. In this manner, the surface region of silicon 482 over N-base 514 and associated with the junction between N-base 514 and neighboring anode region 518 and P-base 538 remain protected. Accordingly, the integrity of the surface of the silicon at these junctions is preserved as to assist more reliable and operable performance of the resulting thyristor memory cell.

In peripheral regions of the semiconductor material for the devices other than the thyristor, the anisotropic etch results in the formation of thick source/drain sidewall spacers 560, for example, against the sidewalls of gates 525 and 526. Similarly, a sidewall spacer 553b is formed against a sidewall of electrode 500 proximate the cathode region for the thyristor. In a particular embodiment, these sidewall spacers 560 and 553 are formed with a width dependent on the thickness of the formerly deposited conformal dielectric 542, 544, 546—i.e., around 20 to 70 nm.

Moving forward with reference to FIG. 13K, photoresist 565 may be deposited and patterned to define a window for assisting formation of cathode regions for the thyristor. The opening of the mask may be defined collectively by the photoresist, the shoulder of electrode 500 and the associated spacer 553b. A substantially vertical implant 534b of N-type dopant, for example, may be used to form an N+ cathode region 536b (FIG. 13L) in the semiconductor material of the substrate. An angled implant 532b of P-type dopant, for example, boron, may be use to form supplemental P-base dopant region 539b as a thinned portion of P-base 538. The thinned portion 539b is defined between cathode region 536b and buried N-well 484. In a particular example, the implant of the supplemental dopant may be performed with an implant angle of about 10 degrees to 70 degrees relative to the orthogonal and with a dosage of approximately $10^{13}$ cm$^{-2}$ and energy of about 30 keV. This may form a concentration peak for the supplemental dopant in the region 539b at a depth of approximately 75 to 100 nm—i.e., disposed between N+ cathode region 536b and buried N-well 484.

In a proposed theoretical explanation (presented merely for purposes of assisting possible understanding for certain embodiment of this invention), a thyristor of this embodiment formed in a shallow region of semiconductor material—for example, in a depth of semiconductor material less than about 400 nm as is associated with that of the shallow trench isolation regions—the thinned portion of the P-based region may be so thin such that the light doping level of the initial substrate and thus associated with the P-base region 538 may be so light so as to effectively result in a full depletion of the majority carriers therein due to the diffusions to neighboring cathode regions 536b and N-well regions 484 (at least for given operative bias or unbiased conditions). In other words, as a result of the Fermi level equilibrium characteristics for semiconductor materials and the associated diffusion properties between the different regions, the distance for the depletion region across the given junction regions (i.e., the depletion length across the junction from the N+ cathode region 536b to the thinned portion of the P-base region and also for the additional depletion length across the separate junction from the buried N-Well 484 to the thinned portion) may be so great so as to consume or extend across an entire thickness of the thinned portion. Accordingly, the thinned portion of the P-base might thus appear effectively as simply an intrinsic insulator between cathode region 536b relative to underlying N-well 484. Under such conditions, the constituent N–P–N bipolar device that was otherwise to form a portion for the functionality of the thyristor might thus be compromised in its ability for lending the thyristor desired forward break-over characteristics (e.g., threshold VFB of FIG. 2).

Accordingly, by way of certain embodiments of the present invention, supplemental dopant for the P-base may be implanted to form a supplemental concentration region 539b at least for the thinned region of the P-base as defined between the cathode region 536b and the underlying N-well 484. With the augmented concentration of dopant, the amount of semiconductor material consumed for the depletion regions within the P-base region (as required for equilibrium of Fermi levels) is much less. The extent of the depletion lengths are reduced and limited so as to avoid full depletion across the thickness of the thinned portion between the neighboring cathode and N-base regions. In other words, the distance for depletion into the P-base region is reduced, whereby a portion of semiconductor material of P-type dopant thus remains available for operability between the cathode region and the underlying N-well. Accordingly, the thyristor remains operable for a memory cell 662 in accordance with an embodiment of the present invention.

Moving forward with further reference to FIG. 13L, upon forming the cathode region 536b and the supplemental dopant region 539b photoresist 565 may be removed and further processes employed (1570 FIG. 15) for defining the deep source/drain implant regions for respective N-channel MOSFETs and P-channel MOSFETs. For these processes, it may again be noted that different photoresist mask (not shown in this particular sequence) may be deposited and patterned over the semiconductor substrate for defining windows for the MOSFET regions that are to be associated with the N-channel MOSFETs via one photoresist mask, and via subsequent photoresist mask regions that assist implants for the P-channel MOSFET devices. Additionally, the further processing may include activation anneals, silicide formations and interconnect processes for further integrating MOSFET devices 560 with thyristor memory 662.

In this particular example, as referenced by FIG. 13L, it may be noted that an opening through the dielectric exposes a select surface region over anode region 518 as defined by winged offset spacer 555b. The patterning of this dielectric, thus, defines the exposed regions of silicon available for silicide formation. For this embodiment, it may be further noted that the surface regions over electrode 500 and cathode 536b remain protected by the previous conformally deposited dielectric 428,429. Likewise, winged spacer 555b protects the surface of silicon over N-base region 514 and the respective junctions defined by N-base 514 relative to neighboring anode region 518 and P-base region 538.

Figure 14A:
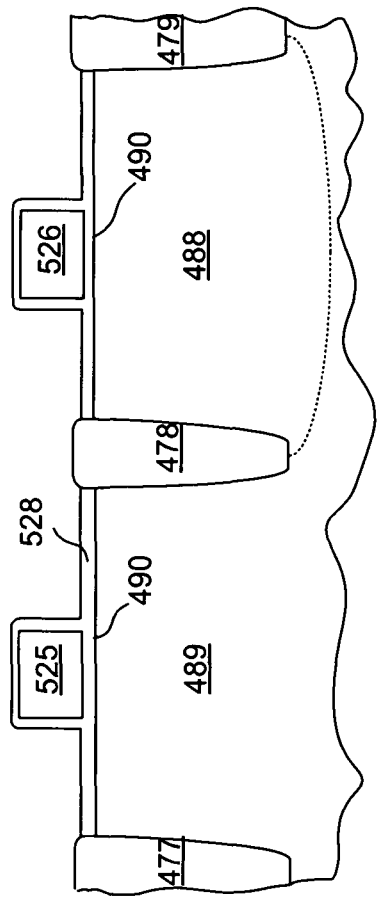
FIGS. 14A-14N are simplified cross-sectional views useful for explaining a method of fabricating a semiconductor device in accordance with an embodiment of the invention, and showing formation of a thyristor together with MOSFETs over a substrate, and also showing separate photomasks employed during patterning of extension spacers about gates for the MOSFETs in the periphery.

In accordance with a further embodiment of the present invention, referencing the cross sectional views of FIGS. 14A-14N, a method of fabrication includes integrating a thyristor cell with MOSFET devices. In this method, a photoresist that is used for defining implant masks for assisting implant of MOSFET devices may likewise be used collectively in the formation of certain hardmasks that are to be used to assist the formation of different regions for the thyristor.

Beginning with reference to FIG. 14A, deep P-well region 482, middle N-well region 484 and top P-well region 486 may be formed in active regions for the thyristor between STI structures 472 and 474. P-wells 489 may be formed in active regions of the semiconductor material to be associated with N-channel devices between STI structures 477 and 478. N-wells 488 may be formed in active areas of the semiconductor material to be associated with P-channel MOSFETs between STI structures 478 and 479.

Gates 525, 526 may be formed over gate oxides over the respective P-well 489 and N-well 488. Likewise, electrode 500 may be patterned and formed over dielectric 490 over the top P-well region 486.

Figure 14B:
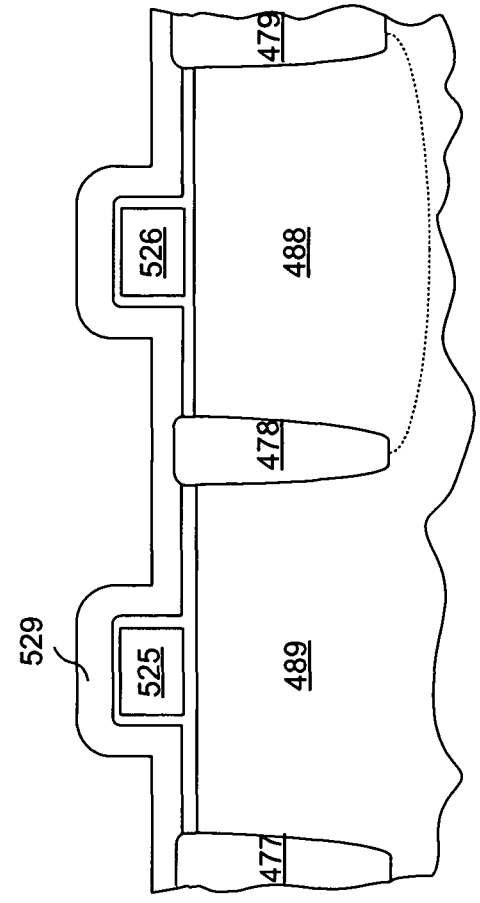

Similarly as described before, conformal oxide 528 may be formed as part of a thin dielectric spacer material for the extension spacers. Oxide 528 may be formed conformally over electrode 500 and gates 525, 526 over associated thyristor and MOSFET regions of semiconductor materials. For example, oxide may be formed with a thickness of about 5 to 10 nm. To complete the oxide/nitride spacer material stack, referencing FIG. 14B, nitride 529 of about 100 nm depth may be conformally layered over the oxide 528.

Photoresist 648, referencing FIG. 14C, may be deposited and patterned to define a window for outlining regions over the thyristor for the anode. An anisotropic etch may be used to directionally etch through the conformal oxy/nitride layer 528, 529 and for exposing regions of silicon over the thyristor areas to be associated with anode region 518. This etch of thin conformal dielectric accordingly forms the winged, offset spacer 555 with a lateral offset from the electrode effective to also be used subsequently as the silicide mask. Thus, mask used for the formation of the N-base and anode regions for the thyristor via respective implants may be the same as that which would be subsequently associated with forming the silicide over the anode regions.

Further referencing FIG. 14C, the photoresist 648 and winged offset spacer 555 may be used collectively as a mask while an angled implant 510 of N-type dopant is performed self-aligned via the peripheral edge defined by the implant mask to form N-base region 514. It may be noted that the implant for N-base region 514 uses energy sufficient to extend the implant of the N-type dopant to a depth effective for meeting N-well 484. N-base.

Describing the N-base region 514, 484 extends downwardly from the surface of the silicon to join with the N-well 484, and is defined, for this example, with a width laterally between P-base region 536 and anode region 518. It may be noted that the stem of N-base region 514 meets the surface of the silicon beneath the protective cover of dielectric of winged offset spacer 555. Further referencing FIG. 14C, the anode region may be formed by substantially vertical implant 512 of P-type dopant for creating P-type anode region 518. In one embodiment, for example, anode region 518 may be formed with a depth of approximately 100 nm and a width of about 0.1 µm. N-base 514 may be formed with a width at the top surface of the silicon of approximately 100 nm and with a depth, for example, of about 100 to 150 nm for joining the buried N-well 484.

Moving forward with reference to FIGS. 14D-14E, photoresist 648 is removed and knew photoresist 740 deposited and patterned to define windows 741 for exposing regions over the semiconductor substrate to be associated with N-channel MOSFETs. Offset spacers 540 of oxy/nitride may be formed with a width of about 5 nm against the sidewalls of gate 525 by an anisotropic etch of the conformal dielectric. In a particular embodiment, the etch associated with forming the extension offset spacers 540 for use in forming the extension regions may slightly etch into a portion of the surface of the silicon to form a slight recess of about 2 nm. In some other embodiments, the etch may incorporate a chemistry selective for etching the oxide and/or nitride more preferably relative to the underlying silicon. In a further embodiment, the etch may stop on the oxide just prior to reaching the silicon. For example, it could employ a predetermined duration for leaving less than about 1 nm of oxide over the silicon.

Further referencing FIG. 14E, the N-type moderately doped drain (source) (MDD) regions or extension region 481 may be formed in a surface layer of P-well 489 by performing implants in self-aligned relationship with respect to gate 525 and as defined by respective extension offset spacers 540.

Moving forward with reference to FIGS. 14F and 14G, photoresist 740 is removed and further photoresist 744 deposited and patterned over the substrate to form window 745 over N-well regions 488 that are to be associated with the formation of P-channel MOSFETs. An anisotropic etch may be performed through the window 745 or the photoresist mask for defining extension spacers 540b against the sidewalls of gate 526. In a particular embodiment, the sidewall spacers may be formed with a thickness or width of about 3 to 10 nm. Using the photoresist 744, gate 526 and sidewall spacers 540b collectively as an implant mask, P-type dopants may be implanted for defining the P-type moderately doped drain (MDD) or extension regions 582 per an implant defined in self-aligned relationship with respect to gate 526 via the offset of extension spacers 540b.

Moving forward with reference to the cross-sectional views of FIGS. 14I-14K, an oxide/nitride/oxide stack 542, 544, 546 may be conformally deposited over the electrode and gate structures on the semiconductor substrate similarly as described before relative to the embodiments disclosed previously herein, with reference to FIGS. 13G-13I. For example, a cap oxide 582 of about a 10 nm depth may be formed over the electrode and gate structures, which may incorporate a rapid thermal anneal for activating the extension region implants. Following this, a 15-20 nm nitride deposition 544 may be conformally deposited over the oxide cap 542. Following the nitride deposition, a 30-35 nm oxide may be conformally deposited as a further portion of the oxy/nitride/oxy stack, from which the source/drain offset spacers may be formed.

Referencing FIG. 14L, an anisotropic etch may be employed for forming source/drain offset spacers 560 against the sidewalls of gates 525 and 526. This etch may likewise form an offset cathode spacer 553b against the sidewall of electrode 500 proximate the cathode region for the thyristor. Referencing FIG. 14M, photoresist 565 may be formed and patterned over the substrate to define a window for exposing regions of the substrate to be associated with the cathode region for the thyristor. The implant mask may be defined collectively by the patterned photoresist 565, the electrode shoulder and the spacer 553b against the sidewall of the electrode 509. A substantially vertical implant 534b of N-type dopant such as arsenic may be used to form the N-type cathode region 536b. An angled implant 532b of P-type dopant such as boron may be used for adding additional supplemental P-type dopant in to a supplemental dopant region 539b for P-base 538.

Referencing FIG. 14N, the photoresist 565 may be removed from over thyristor memory cell 762 and MOSFETs 760. Additional CMOS processing may then be further used to form the deep source or deep drain regions for the respective N-channel and P-channel MOSFETs, which in turn may incorporate different photoresist masks and implant procedures. Activation anneals and/or silicide processes may also be performed together with interconnect processes so as to complete fabrication of the thyristor memory cell integrated collectively with the MOSFET devices. As a part of the further CMOS processing, it may be understood that contact windows may be formed through the thin dielectric material of the previous conformally layered dielectric stack so as to permit contacts to electrode 500 and cathode region 536b.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof.

What is claimed is:

1. A method of semiconductor fabrication, comprising:
    forming a first well, a second well and a third well in a thyristor region within a semiconductor substrate;
    wherein the first well is formed above the second well;
    wherein the second well is formed above the third well;
    wherein the second well is a completely buried well;
    wherein the third well is located below the second well;
    wherein the first well and the third well have a first-type conductivity;
    wherein the second well has a second-type conductivity different from the first-type conductivity;
        forming a control gate for a thyristor over the semiconductor substrate of the thyristor region;
        forming gates for MOSFETs over a MOSFET region of the semiconductor substrate;
        forming a first dielectric layer conformally over the control gate of the thyristor in the thyristor region and the gates of the MOSFETs in the MOSFET region;
    forming a second dielectric layer conformally on the first dielectric layer over the control gate of the thyristor in the thyristor region and the gates of the MOSFETs in the MOSFET region;
    forming a third dielectric layer conformally on the second dielectric layer over the control gate of the thyristor in the thyristor region and the gates of the MOSFETs in the MOSFET region;
    depositing and patterning first photoresist to provide a first mask with a first window to etch exposed portions of the first dielectric layer in the MOSFET region;
    anisotropically etching portions of the first dielectric layer, the second dielectric layer, and the third dielectric layer in the MOSFET region through the first window of the first mask to form extension spacers against sidewalls of the gates of the MOSFETs;

implanting first dopants for extension regions of the MOSFETs, the implanting to form the extension regions self-aligned with respect to the gates via the extension spacers;

depositing and patterning second photoresist to provide a second mask over the thyristor region and the MOSFET region, the second mask having a second window over at least portions of the thyristor region;

exposing the third dielectric layer through the second window of the second mask in the thyristor region while the second mask is not removed over the MOSFET region;

anisotropically etching portions of the third dielectric layer in the thyristor region through the second window of the second mask so as to expose the second dielectric layer for implantation;

implanting second dopants through the second window of the second mask for either an anode region or a cathode region for the thyristor, the implanting of the second dopants being in self-aligned relationship via the second mask; and implanting third dopants through the second window of the second mask for a first base region for the thyristor, the implanting of the third dopants being in self-aligned relationship via the second mask.

2. The method according to claim 1, further comprising:

depositing and patterning third photoresist to provide a third mask having a third window over at least portions of the MOSFETs portions;

etching exposed portions of the second dielectric layer via the third window of the third photoresist to form offset spacers about the sidewalls of the gates; and implanting fourth dopants into source and drain regions for the MOSFETs self-aligned with respect to the gates via the offset spacers.

3. The method according to claim 1, wherein the first dielectric layer for the extension spacers is formed from a conformal oxide deposition and a conformal nitride deposition.

4. The method according to claim 1, wherein the implanting of the third dopants as a first base dopant for the first base region uses an angle of incidence less than 90 degrees for penetrating and extending the third dopants for the first base region laterally beneath a peripheral edge of the second mask; and wherein the implanting of the second dopants as anode dopant into the anode region for the thyristor as defined via the second mask using an angle of incidence for the implanting of the anode dopant that is substantially orthogonal with respect to a top surface defined by the semiconductor substrate.

5. The method according to claim 4, wherein the anisotropic etching of the second dielectric layer through the first window of the first mask employs a selective physical chemistry for etching more favorably the second dielectric layer with respect to the first dielectric layer.

6. The method according to claim 5, wherein the implanting of the first base dopant for the first base region and the implanting of the anode dopant for the anode region use energies of implant sufficient to pass the first base dopant and the anode dopant through the first dielectric layer as the screen layer and into respective select regions of the semiconductor substrate, the respective select regions for the first base region and the anode region defined at least in part by the second mask, as well as respective angles of incidence and the energies used for the implanting of the first base dopant and the implanting of the anode dopant.

7. The method according to claim 4, wherein the anisotropic etching of the second dielectric layer stops on and upon exposing the first dielectric layer at least over areas of a well associated with the first well.

8. The method according to claim 4, wherein each of the formation of the second mask, the implanting for the first base region and the implanting for the anode region is performed while using the first dielectric layer as a protective layer over the thyristor region of the semiconductor substrate, wherein the first dielectric layer is used as a protective layer of the semiconductor substrate during the etching of the second dielectric layer, and wherein the first dielectric layer is used as a protective screen layer when implanting the first base dopant and the anode dopant into the first base region and the anode region, respectively, for the thyristor.

9. The method according to claim 4, further comprising:

forming an isolation trench in the semiconductor substrate, the isolation trench defining at least in part a lateral periphery to the well region; and forming a T-well in the thyristor region of the semiconductor substrate;

wherein the T-well is formed in the semiconductor substrate at a depth less than the depth of the isolation trench.

10. The method according to claim 9, wherein the implanting of the third dopants for the first base region includes:

using a same polarity-type as that of the buried T-well; and using implant energy sufficient to penetrate the first base dopant into a of the semiconductor substrate to a depth for reaching and joining the first base region with the buried T-well.

11. The method according to claim 10, further comprising:

forming a third mask with a third window operable to define, responsive to a projected outline of the third window, a select region of the semiconductor substrate for the cathode region for the thyristor; and implanting fourth dopants for the cathode region through the third window of the third mask into the select region.

12. The method according to claim 11, wherein the forming of the third mask includes:

depositing and patterning third photoresist having the third window to expose portions of the second dielectric layer over a shoulder of the control gate proximate the cathode region; and anisotropically etching the exposed portions of the second dielectric layer and forming a cathode spacer against a sidewall of the control gate proximate the cathode region.

13. The method according to claim 12, wherein the etching of the second dielectric layer to form the cathode spacer against the sidewall of the control gate stops on the first dielectric layer; and the implanting of the fourth dopants as a cathode dopant uses implant energy operable to pass the cathode dopant through a thickness of the first dielectric layer and into the select region for the cathode region.

14. The method according to claim 12, wherein the etching of the second dielectric layer when forming the cathode spacer against the sidewall of the control gate comprises etching through a thickness of the second dielectric layer and then additionally etching through the thickness of the first dielectric layer to form an exposure window for the third mask to be defined at least in part by the shoulder of the control gate and the cathode spacer formed against the sidewall of the control gate.

15. The method according to claim 12, wherein the third window of the third photoresist further exposes portions of the second dielectric layer over the MOSFET region; and wherein the anisotropic etching of the second dielectric layer for the forming the cathode spacer against the control gate, similarly etches the second dielectric layer over the MOSFET region and forms source/drain spacers against the sidewalls of the gates.

16. The method according to claim 15, wherein the implanting for the cathode region is performed through the fourth window of the fourth photoresist and self-aligned with respect to the control gate as defined by the cathode spacer, wherein the periphery of the fourth window is defined at least in part by the shoulder of the control gate with the cathode spacer, and the implanting for the cathode region uses an implant energy operable to penetrate the fourth dopants to a depth in the semiconductor substrate that is less than the depth of a junction defined between the T-well and a second base region, wherein the second base region is a p-base region.

17. The method according to claim 16, further comprising:

implanting supplemental base dopant into a select region of a second base region of the thyristor, the select region defined by the fourth window of the fourth photoresist of the third mask, which is defined at least in part by the shoulder of the control gate and the cathode spacer;

wherein the implanting of the supplemental base dopant into the second base region uses implant energy and implant angle sufficient to place the supplemental base dopant into a buried region of the semiconductor substrate between the cathode region and the T-well.

18. The method according to claim 15, wherein the forming of the third mask further comprises:

removing the third photoresist having the third window; and depositing and patterning fourth photoresist having a fourth window over the cathode region, the cathode spacer and the shoulder of the control gate while protecting other regions of the semiconductor substrate.

19. A method of fabricating a thyristor-based semiconductor device, comprising:

forming a first well, a second well and a third well in a thyristor region within a semiconductor substrate;

wherein the first well is formed above the second well;

wherein the second well is formed above the third well;

wherein the second well is a completely buried well;

wherein the third well is located below the second well;

wherein the first well and the third well have a first-type conductivity;

wherein the second well has a second-type conductivity different from the first-type conductivity;

forming isolation trenches in the semiconductor substrate of a p/n-type conductivity, to define at least in part a lateral extent to an active region of the semiconductor substrate;

forming the second well within the active region of the semiconductor substrate, the second well formed with an n/p-type conductivity and depth less than that of the isolation trenches;

forming a control gate in an insulated, capacitively-coupled relationship over a p/n-base region for the thyristor within the active region, wherein the p/n-base region is defined at least in part between the second well and the a top surface of the semiconductor substrate over which the control gate is disposed;

forming an n/p-base region for the thyristor within the active region of the semiconductor substrate with an inverted "T" structure, defined at least in part by the second well, wherein a stem for the inverted "T" structure is formed with the n/p-type conductivity that joins the second well to incorporate the second well operably as a portion of the n/p base region;

forming an anode/cathode region within the active region to border a side of the stem opposite the p/n-base;

forming a cathode/anode region within the active region of semiconductor substrate in self-aligned relationship with respect to a shoulder of the control gate distal the anode/cathode region for the thyristor, wherein the cathode/anode region is formed with depth sufficiently shallow to define a thinned portion of the p/n-base region between the cathode/anode region and the second well;

forming MOSFET devices for electrical integration with and during fabrication of the thyristor;

wherein a first dielectric layer, a second dielectric layer, and a third dielectric layer are conformally formed and etched to define extension spacers against a gate of the MOSFET;

wherein the first dielectric layer, the second dielectric layer, and the third dielectric layer are similarly conformally layered over the semiconductor substrate of the active region for the thyristor; and portions of the conformally layered dielectric is kept over and against the active region for preserving an integrity at the top surface of the semiconductor substrate therefor during masking and implanting processes associated with forming the at least one of (i) the stem to the n/p-base, (ii) the anode/cathode region, and (iii) the cathode/anode region.

20. The method according to claim 19, further comprising implanting further p/n-type conductivity dopant into the thinned portion of the p/n-base region, and forming a supplemental concentration for the dopant in the thinned portion that is greater than a concentration therefor in another portion of the p/n-base region.

21. The method according to claim 19, further comprising implanting supplemental base dopant into the portion of the p/n-base region disposed between the buried well and the cathode/anode region and forming a concentration enhancement for the supplemental dopant therein sufficient to form the thyristor with a predetermined and enhanced forward break-over voltage characteristic.

22. The method according to claim 21, wherein implanting of the supplemental base dopant comprises:

implanting the supplemental base dopant using an angle of incidence for the implant of between about 10 to 70 degrees from the orthogonal, a dosage of about $10^{13}$ cm$^{-2}$ to $10^{14}$ cm$^{-2}$.

* * * * *